(12) United States Patent
Aratake et al.

(10) Patent No.: US 8,304,965 B2
(45) Date of Patent: Nov. 6, 2012

(54) PACKAGE, METHOD FOR MANUFACTURING THE SAME, PIEZOELECTRIC VIBRATOR, OSCILLATOR, ELECTRONIC DEVICE, AND RADIO-CONTROLLED TIMEPIECE

(75) Inventors: Kiyoshi Aratake, Chiba (JP); Takeshi Sugiyama, Chiba (JP); Junya Fukuda, Chiba (JP)

(73) Assignee: Seiko Instruments Inc., Chiba (JP)

( * ) Notice: Subject to any disclaimer, the term of this patent is extended or adjusted under 35 U.S.C. 154(b) by 310 days.

(21) Appl. No.: 12/868,310

(22) Filed: Aug. 25, 2010

(65) Prior Publication Data

US 2011/0050045 A1    Mar. 3, 2011

(30) Foreign Application Priority Data

Aug. 25, 2009   (JP) ................. 2009-194476

(51) Int. Cl.
*H01L 41/22* (2006.01)
*H01L 41/053* (2006.01)
*H03H 9/215* (2006.01)

(52) U.S. Cl. ........ 310/344; 310/348; 310/370; 29/25.35
(58) Field of Classification Search ................. 310/344, 310/348, 370; 29/25.35
See application file for complete search history.

(56) References Cited

U.S. PATENT DOCUMENTS 7,508,132 B2 * 3/2009 Chen et al. ............ 313/553

FOREIGN PATENT DOCUMENTS

JP  2006-086585 A   3/2006
JP  2011-131207    * 7/2011

* cited by examiner

*Primary Examiner* — Thomas Dougherty
(74) *Attorney, Agent, or Firm* — Brinks Hofer Gilson & Lione

(57) ABSTRACT

Providing a package and a method for manufacturing the package capable of achieving improvement in the degree of vacuum in the cavity, and to provide a piezoelectric vibrator, an oscillator, an electronic device, and a radio-controlled timepiece. There is provided a package which includes a plurality of kinds of gettering materials 20, 21 having different activation temperatures and which are capable of being activated by heating is disposed in the cavity C.

20 Claims, 14 Drawing Sheets

PACKAGE, METHOD FOR MANUFACTURING THE SAME, PIEZOELECTRIC VIBRATOR, OSCILLATOR, ELECTRONIC DEVICE, AND RADIO-CONTROLLED TIMEPIECE

RELATED APPLICATIONS

This application claims priority under 35 U.S.C. §119 to Japanese Patent Application No. 2009-194476 filed on Aug. 25, 2009, the entire content of which is hereby incorporated by reference.

FIELD OF THE INVENTION

The present invention relates to a package, a method for manufacturing the package, a piezoelectric vibrator, and an oscillator, an electronic device, and a radio-controlled timepiece.

BACKGROUND ART

Recently, a piezoelectric vibrator (package) utilizing quartz or the like has been used in a cellular phone and a portable information terminal as the time source, the timing source of a control signal, a reference signal source, and the like. The piezoelectric vibrator of this type is proposed in a variety of forms, and an SMD-type piezoelectric vibrator is one example. The SMD-type piezoelectric vibrator includes, for example, a base board and a lid board which are bonded to each other, a cavity formed between the two boards, and a piezoelectric vibrating reed (electronic component) accommodated in a state of being airtightly sealed in the cavity.

In addition, in the manufacturing process of the piezoelectric vibrator, there is known a technique in which a bonding film is formed on a lower surface of the lid board (a bonding surface to be bonded to the base board) when the lid board is bonded to the base board, and the base board and the lid board are anodically bonded using the bonding film. Specifically, the two boards are heated in a state of being superimposed onto each other, and a voltage is applied to the bonding film. By doing so, an electrochemical reaction occurs at an interface between the bonding film and the base board, whereby the two boards can be closely adhered tightly.

However, in the described piezoelectric vibrator, when the piezoelectric vibrator is heated, for example, during the anodic bonding of the lid board and the base board, outgas (for example, oxygen) is discharged into the cavity. When the outgas is present in the cavity, the degree of vacuum in the cavity decreases, and an equivalent resistance value (effective resistance value Re) increases. As a result, there is a problem in that the drive voltage of the piezoelectric vibrator increases, and thus energy efficiency decreases.

As a method of increasing the degree of vacuum in the cavity and suppressing the equivalent resistance value, gettering is known, for example. Gettering is a method of disposing a metal film in the cavity as a gettering material, heating the gettering material to be activated, thus absorbing outgas present in the cavity by a chemical reaction of the gettering material. For example, JP-A-2006-86585 discloses a configuration in which a bonding film is formed on the entire surface of the lid board facing the base board, and a gettering material made, for example, of magnesium is contained in the bonding film. According to this configuration, by heating the bonding film containing the gettering material with electron beams, or the like when the lid board and the base board are bonded together, the bonding film is melted, so that the lid board is bonded to the base board, and outgas discharged into the cavity during the bonding can be absorbed by the gettering material.

However, the configuration disclosed in JP-A-2006-86585 has a problem in that it is difficult to increase sufficiently the degree of vacuum in the cavity. That is to say, in the configuration disclosed in JP-A-2006-86585, since the gettering material is contained in the bonding film, the outgas will be discharged from the bonding film at the same time as the gettering. For this reason, there is a problem in that it is difficult to absorb the outgas discharged from the bonding film immediately before the end of the gettering and during periods after the end of the gettering until the temperature of the piezoelectric vibrator decreases.

To solve the problems, a method in which before bonding the lid board and the base board, the bonding film is heated to a high temperature in advance to preliminarily discharge the outgas from the bonding film, and then the lid board and the base board are bonded together may be considered. However, according to this method, since the gettering material will be degraded before bonding the lid board and the base board, there is a problem in that it is difficult to absorb the outgas present in the cavity after bonding.

SUMMARY OF THE INVENTION

The present invention has been made in view of the foregoing, and an object of the present invention is to provide a package and a method for manufacturing the package capable of achieving improvement in the degree of vacuum in the cavity, and to provide a piezoelectric vibrator, an oscillator, an electronic device, and a radio-controlled timepiece.

In order to solve the above-mentioned problems and attain the object, according to an aspect of the present invention, there is provided a package which includes a plurality of boards bonded to each other and a cavity formed between the plurality of boards, and which is capable of sealing an electronic component in the cavity, wherein a gettering material capable of being activated by heating to absorb gas present in the cavity is disposed in the cavity, and the gettering material includes a plurality of kinds of gettering materials having different activation temperatures.

According to this configuration, by disposing the plurality of kinds of gettering materials having different activation temperatures in the cavity, it is possible to activate the gettering materials at plural temperature ranges and absorb outgas present in the cavity. In this case, since outgas which was not completely absorbed by a gettering material having a low activation temperature can be absorbed by a gettering material having a higher activation temperature, it is possible to improve the degree of vacuum in the cavity. In this way, it is possible to provide a package having a low drive voltage.

The gettering material may include a first gettering material that is activated at a first activation temperature and a second gettering material that is activated at a second activation temperature higher than the first activation temperature, and among the gettering materials, at least the first gettering material is made of a non-evaporating gettering material which is capable of being activated by heating to absorb gas in the cavity on a surface thereof.

According to this configuration, by using a non-evaporating gettering material as at least the first gettering material, it is possible to prevent scattering of the gettering material in the cavity during the activation. In addition, since the non-evaporating gettering material can be activated at a relatively low temperature compared to the evaporating gettering material, by heating the gettering material to a high temperature, it is possible to suppress the outgas from being discharged into the cavity again.

The second gettering material may be formed with an irradiation mark to which a laser beam is irradiated.

According to this configuration, by irradiating the second gettering material with a laser beam, it is possible to locally heat only the second gettering material with a laser beam to activate the second gettering material. In this case, since it is possible to prevent a temperature rise of the entire package, it is possible to prevent generation of outgas resulting from the temperature rise of the package and effectively absorb the outgas remaining in the cavity.

According to another aspect of the present invention, there is provided a method for manufacturing a package which includes a plurality of boards bonded to each other and a cavity formed between the plurality of boards, and which is capable of sealing an electronic component in the cavity, the method including: a gettering material disposing step of disposing a plurality of kinds of gettering materials having different activation temperatures in the cavity; a bonding step of bonding the plurality of boards together; and a gettering step of activating the gettering material to absorb gas present in the cavity, wherein the gettering material disposing step involves disposing a first gettering material that is activated at a first activation temperature and a second gettering material that is activated at a second activation temperature higher than the first activation temperature, and the gettering step includes: a first gettering step of heating the first gettering material to the first activation temperature or higher and thus activating the first gettering material; and a second gettering step of heating the second gettering material to the second activation temperature or higher and thus activating the second gettering material.

According to this configuration, by performing the first gettering step after completion of the bonding step, it is possible to absorb outgas discharged into the cavity during the bonding step with the first gettering material.

Particularly, by performing the second gettering step after completion of the first gettering step, it is possible to absorb outgas remaining in the cavity after completion of the first gettering step, such as the remaining outgas generated during the bonding step or outgas discharged by heating during the first gettering step. In this way, since the degree of vacuum in the cavity can be improved, it is possible to provide a package having high energy efficiency.

The bonding step may involve applying a voltage to a conductive bonding film formed between the plurality of boards in a state of heating the bonding film to a bonding temperature to achieve anodic bonding of the plurality of boards, and the first gettering material may be made of such a material that the first activation temperature is higher than the bonding temperature.

According to this configuration, since the first gettering material is made of such a material that the first activation temperature is higher than the bonding temperature during the bonding step, it is possible to prevent the first gettering material from being activated before bonding the boards and effectively absorb the outgas present in the cavity in the later first gettering step.

The gettering step may involve irradiating the laser beam towards the second gettering material from an outside of the cavity and thus heating the second gettering material to the second activation temperature or higher.

According to this configuration, by locally heating only the second gettering material with the laser beam, it is possible to suppress a temperature rise of the entire package. In this way, it is possible to prevent generation of outgas resulting from the temperature rise of the package and effectively absorb the outgas remaining in the cavity.

According to a further aspect of the present invention, there is provided a piezoelectric vibrator in which a piezoelectric vibrating reed is airtightly sealed in the cavity of the package according to the above aspect of the present invention.

According to this configuration, since the piezoelectric vibrating reed is airtightly sealed in the cavity of the package according to the above aspect of the present invention, it is possible to provide a piezoelectric vibrator having high energy efficiency and stable vibration characteristics.

The piezoelectric vibrating reed may be formed with a mass adjustment film for achieving mass adjustment of the piezoelectric vibrating reed, the mass adjustment film may be configured to be removed by a laser beam so that mass adjustment of the piezoelectric vibrating reed is achieved, and the mass adjustment film and the gettering material may be disposed at positions where they do not overlap with each other in the direction where the laser beam is irradiated.

According to this configuration, since the laser beam will not be blocked by the gettering material, the laser beam can be effectively irradiated onto the mass adjustment film. In addition, as described above, when the second gettering material is activated with a laser beam, since the laser beam will not be blocked by the mass adjustment film, the laser beam can be effectively irradiated onto the second gettering material.

In this way, a desired mass adjustment film can be removed quickly, and the gettering material can be activated quickly. Therefore, it is possible to improve manufacturing efficiency.

According to a still further aspect of the present invention, there is provided an oscillator in which the piezoelectric vibrator according to the above aspect of the present invention is electrically connected to an integrated circuit as an oscillating piece.

According to a still further aspect of the present invention, there is provided an electronic device in which the piezoelectric vibrator according to the above aspect of the present invention is electrically connected to a timer portion.

According to a still further aspect of the present invention, there is provided a radio-controlled timepiece in which the piezoelectric vibrator according to the above aspect of the present invention is electrically connected to a filter portion.

According to the oscillator, electronic device, and radio-controlled timepiece according to the above aspect of the present invention, since they include the piezoelectric vibrator according to the above aspect of the present invention, it is possible to provide products having high quality and high reliability.

According to the package and the package manufacturing method according to the above aspect of the present invention, by performing the first gettering step after completion of the bonding step, it is possible to absorb outgas discharged into the cavity during the bonding step with the first gettering material.

Particularly, by performing the second gettering step after completion of the first gettering step, it is possible to absorb outgas remaining in the cavity after completion of the first gettering step, such as the remaining outgas generated during the bonding step or outgas discharged by heating during the first gettering step. In this way, since the degree of vacuum in the cavity can be improved, it is possible to provide a package having high energy efficiency.

According to the piezoelectric vibrator according to the above aspect of the present invention, since the piezoelectric vibrating reed is airtightly sealed in the cavity of the package according to the above aspect of the present invention, it is possible to provide a piezoelectric vibrator having high energy efficiency and stable vibration characteristics.

According to the oscillator, electronic device, and radio-controlled timepiece according to the above aspect of the present invention, since they include the piezoelectric vibrator according to the above aspect of the present invention, it is possible to provide products having high quality and high reliability.

DETAILED DESCRIPTION OF THE PREFERRED EMBODIMENTS

Figure 1:
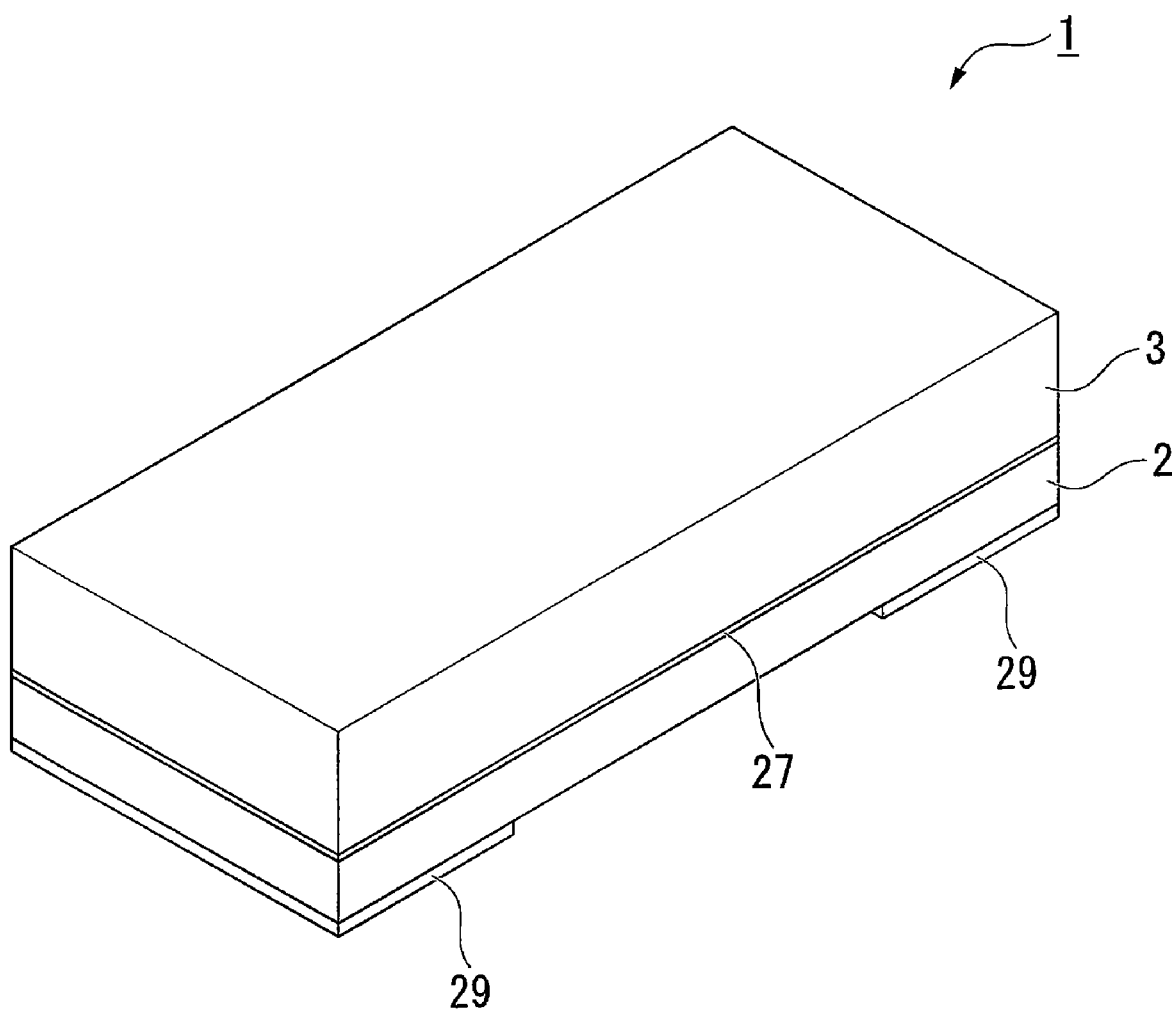
FIG. 1 is a perspective view showing an external appearance of a piezoelectric vibrator according to an embodiment of the present invention.
Figure 2:
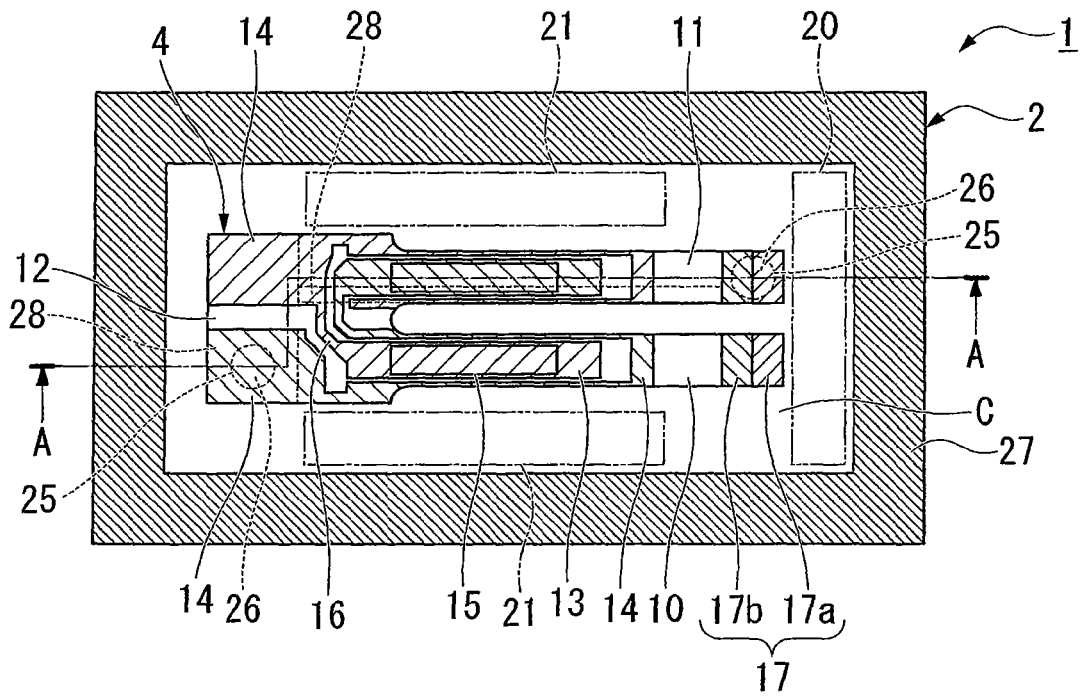
FIG. 2 is a top view showing an inner structure of the piezoelectric vibrator shown in FIG. 1 when a piezoelectric vibrating reed is viewed from above with a lid board removed.
Figure 3:
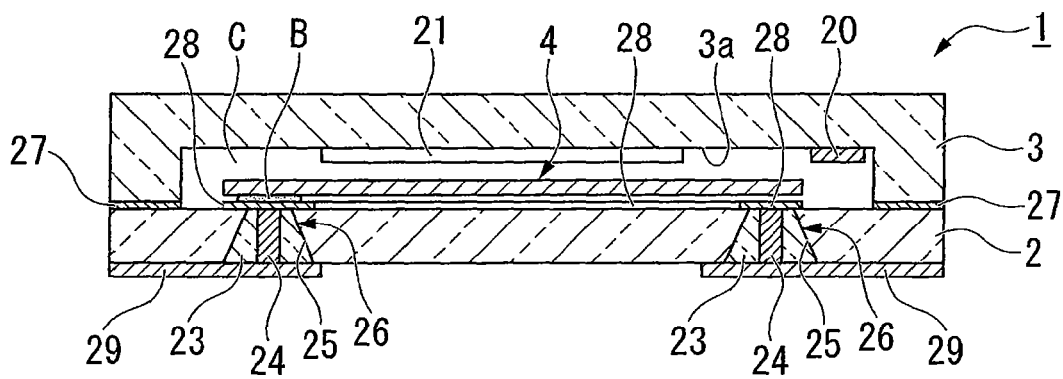
FIG. 3 is a sectional view of the piezoelectric vibrator taken along the line A-A in FIG. 2.
Figure 4:
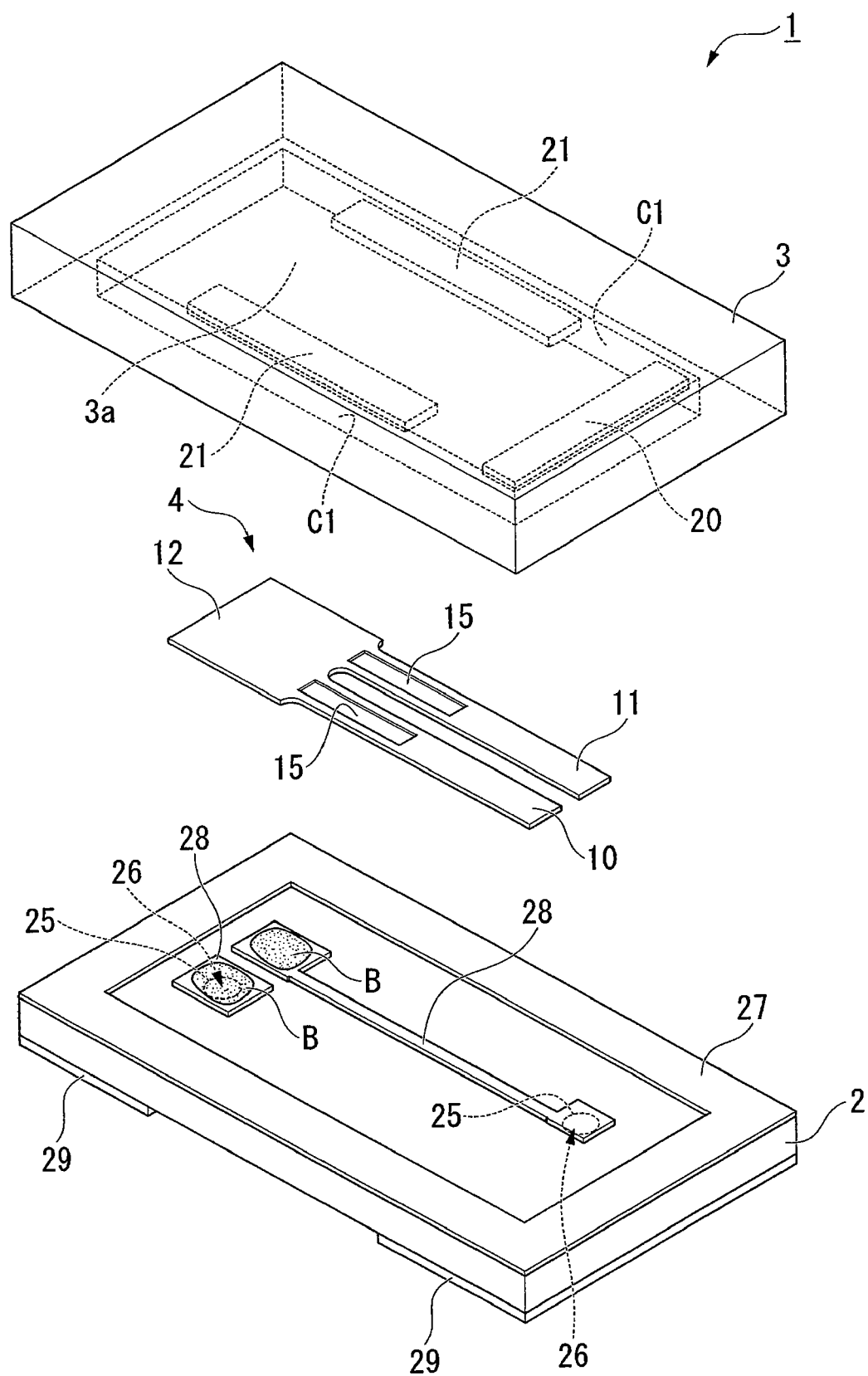
FIG. 4 is an exploded perspective view of the piezoelectric vibrator shown in FIG. 1.

Hereinafter, an embodiment of the present invention will be described with reference to the drawings.
Piezoelectric Vibrator FIG. 1 is a perspective view showing an external appearance of a glass-packaged piezoelectric vibrator according to an embodiment. FIG. 2 is a top view showing an inner structure of the piezoelectric vibrator shown in FIG. 1 when a piezoelectric vibrating reed is viewed from above with a lid board removed. FIG. 3 is a sectional view of the piezoelectric vibrator taken along the line A-A in FIG. 2, and FIG. 4 is an exploded perspective view of the piezoelectric vibrator.

As shown in FIGS. 1 to 4, a piezoelectric vibrator 1 of the present embodiment is an SMD-type piezoelectric vibrator which is formed in the form of a box laminated in two layers of a base board 2 and a lid board 3 and in which a piezoelectric vibrating reed 4 is accommodated in a cavity C (see FIG. 2) at an inner portion thereof.

In FIG. 2, gettering materials 20 and 21 to be formed on the lid board 3 are denoted by a chain line. In FIG. 4, for better understanding of the drawings, illustrations of excitation electrodes 13, extraction electrodes 16, mount electrodes 14, and weight metal film 17 are omitted.

Figure 5:
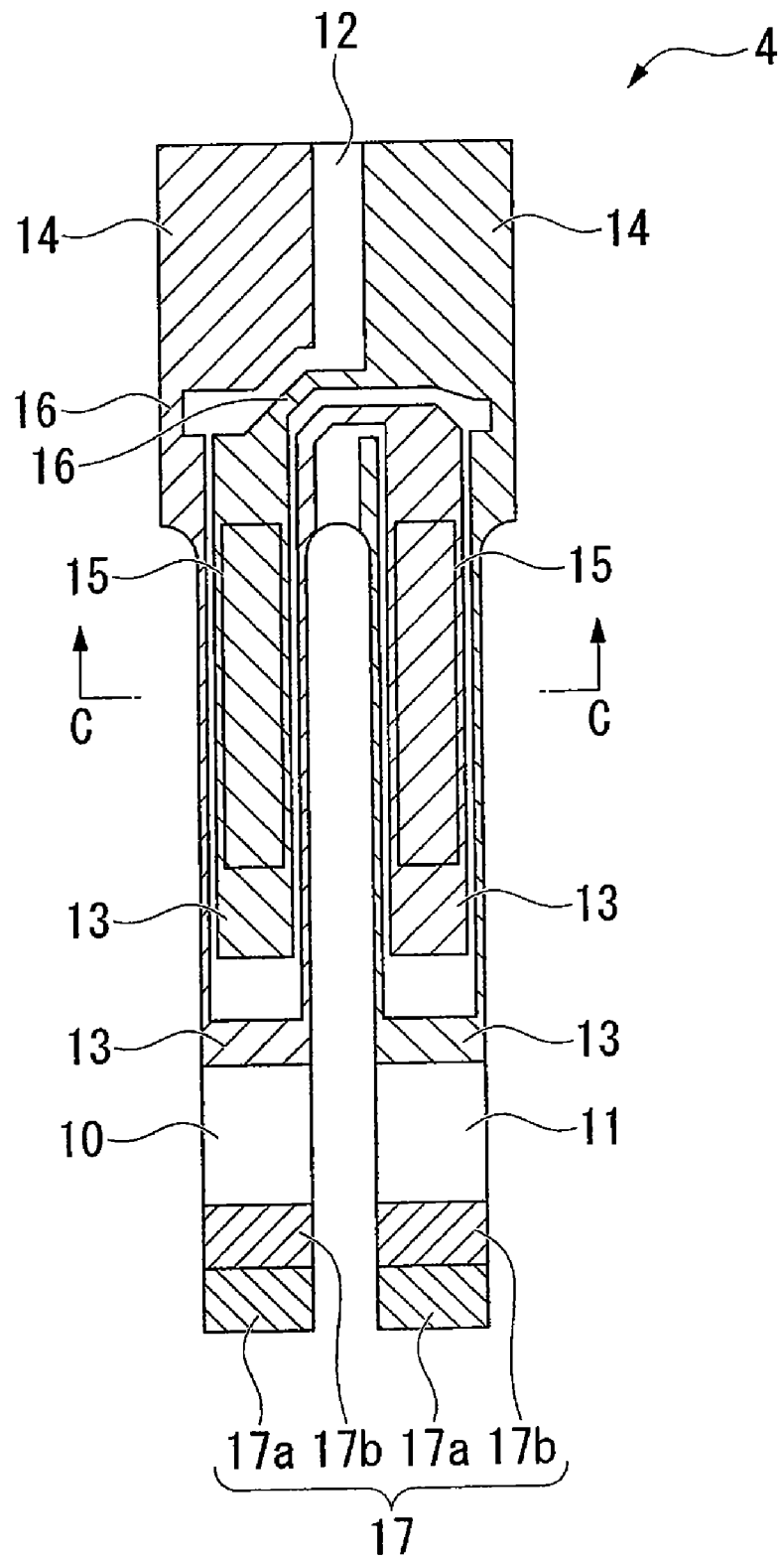
FIG. 5 is a top view of the piezoelectric vibrating reed that constitutes the piezoelectric vibrator shown in FIG. 1.
Figure 6:
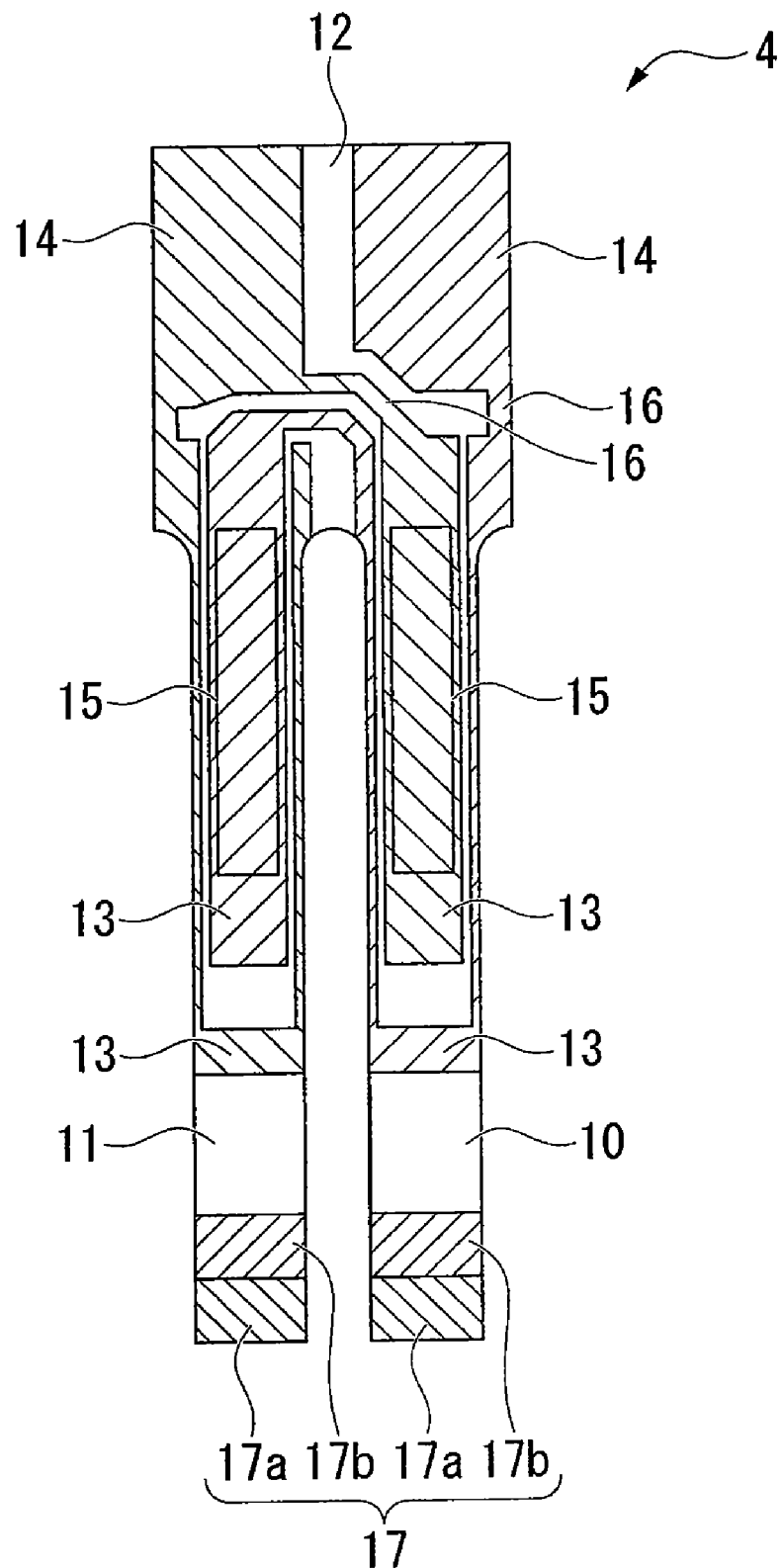
FIG. 6 is a bottom view of the piezoelectric vibrating reed shown in FIG. 5.
Figure 7:
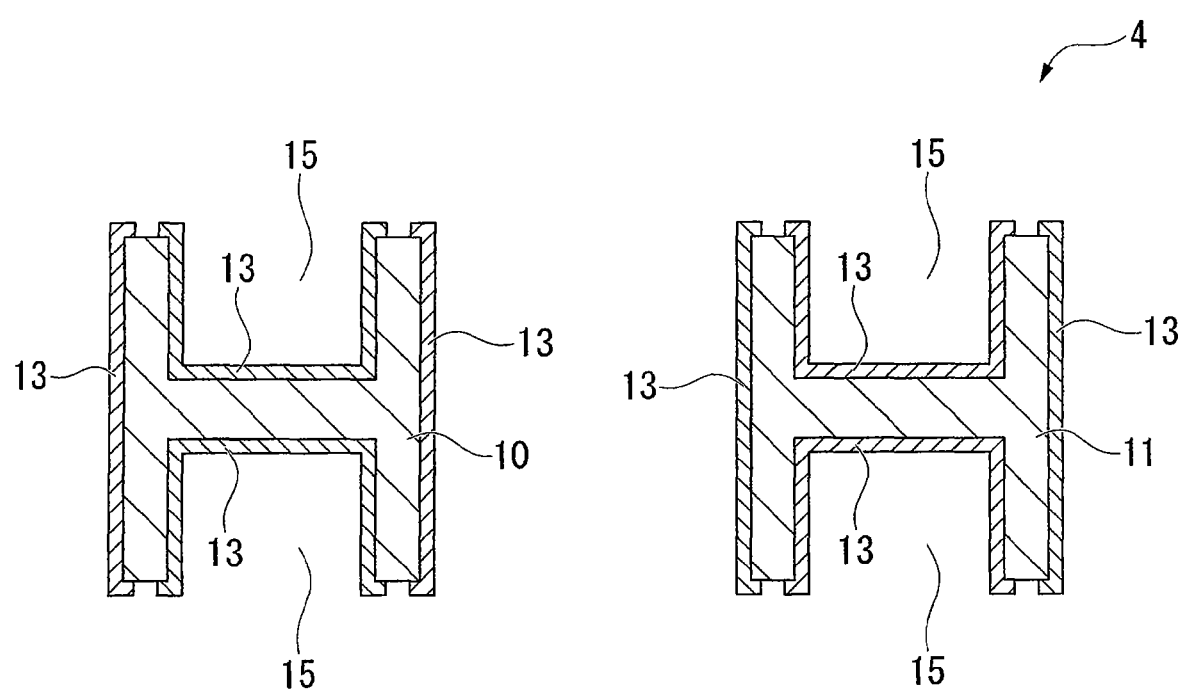
FIG. 7 is a sectional view taken along the line C-C in FIG. 5.

FIG. 5 is a top view of the piezoelectric vibrating reed and FIG. 6 is a bottom view thereof. FIG. 7 is a sectional view taken along the line C-C in FIG. 5.

As shown in FIGS. 5 to 7, the piezoelectric vibrating reed 4 is a tuning-fork type vibrating reed which is made of a piezoelectric material such as quartz crystal, lithium tantalate, or lithium niobate and is configured to vibrate when a predetermined voltage is applied thereto.

The piezoelectric vibrating reed 4 includes: a pair of vibrating arms 10 and 11 disposed in parallel to each other; a base portion 12 to which the base end sides of the pair of vibrating arms 10 and 11 are integrally fixed; excitation electrodes 13 which are formed on the outer surfaces of the pair of vibrating arms 10 and 11 so as to allow the pair of vibrating arms 10 and 11 to vibrate; and mount electrodes 14 which are electrically connected to the excitation electrodes 13.

In addition, the piezoelectric vibrating reed 4 according to the present embodiment is provided with groove portions 15 which are formed on both principal surfaces of the pair vibrating arms 10 and 11 along the longitudinal direction of the vibrating arms 10 and 11. The groove portions 15 are formed so as to extend from the base end sides of the vibrating arms 10 and 11 up to approximately the middle portions thereof.

The excitation electrodes 13 are electrodes that allow the pair of vibrating arms 10 and 11 to vibrate at a predetermined resonance frequency in a direction to move closer to or away from each other and are patterned and formed on the outer surfaces of the pair of vibrating arms 10 and 11 in an electrically isolated state. Specifically, as shown in FIG. 7, one excitation electrode 13 is mainly formed on the groove portion 15 of one vibrating arm 10 and both side surfaces of the other vibrating arm 11. On the other hand, the other excitation electrode 13 is mainly formed on both side surfaces of the one vibrating arm 10 and the groove portion 15 of the other vibrating arm 11.

Moreover, as shown in FIGS. 5 and 6, the excitation electrodes 13 are electrically connected to the mount electrodes 14 via the extraction electrodes 16, respectively, on both principal surfaces of the base portion 12. A voltage is applied to the piezoelectric vibrating reed 4 via the mount electrodes 14.

The above-mentioned excitation electrodes 13, mount electrodes 14, and extraction electrodes 16 are formed by a coating of a conductive film of chromium (Cr), nickel (Ni), aluminum (Al), and titanium (Ti), for example.

Furthermore, the tip ends of the pair of vibrating arms 10 and 11 are coated with a weight metal film (mass adjustment film) 17 for mass adjustment of their own vibration states (tuning the frequency) in a manner such as to vibrate within a predetermined frequency range. The weight metal film 17 is divided into a rough tuning film 17a used for tuning the frequency roughly and a fine tuning film 17b used for tuning the frequency finely. By tuning the frequency with the use of the rough tuning film 17a and the fine tuning film 17b, the frequency of the pair of the vibrating arms 10 and 11 can be set to fall within the range of the nominal (target) frequency of the device.

The piezoelectric vibrating reed 4 configured in this way is bump-bonded to an upper surface of the base board 2 by bumps B made of gold or the like as shown in FIGS. 3 and 4. More specifically, bump bonding is achieved in a state where the pair of mount electrodes 14 come into contact with two bumps B formed on lead-out electrodes 28 described later, respectively. In this way, the piezoelectric vibrating reed 4 is supported in a state of being floated from the upper surface of the base board 2, and the mount electrodes 14 and the lead-out electrodes 28 are electrically connected to each other.

The lid board 3 is a transparent insulating board made of a glass material, for example, soda-lime glass, and is formed in a board-like form as shown in FIGS. 1, 3, and 4. A lower surface side of the lid board 3 (a bonding surface side thereof to be bonded with the base board 2) is formed with a rectangular recess portion 3a (see FIGS. 3 and 4) in which the piezoelectric vibrating reed 4 is accommodated. The recess portion 3a is a recess portion for a cavity serving as the cavity C that accommodates the piezoelectric vibrating reed 4 when the two boards 2 and 3 are superimposed onto each other. The lid board 3 is anodically bonded to the base board 2 in a state where the recess portion 3a faces the base board 2.

The base board 2 is a transparent insulating board made of glass material, for example, soda-lime glass, similarly to the lid board 3, and is formed in a board-like form having a size capable of being overlapped with the lid board 3, as shown in FIGS. 1 to 4.

The base board 2 is formed with a pair of through-holes 25 penetrating through the base board 2. The through-holes 25 are formed in a tapered form whose diameter gradually increases from the upper surface of the base board 2 towards the lower surface thereof. At this time, the pair of through-holes 25 are formed so as to be received in the cavity C. More specifically, one through-hole 25 is positioned close to the base portion 12 of the mounted piezoelectric vibrating reed 4, and the other through-hole 25 is positioned close to the tip ends of the vibrating arms 10 and 11. The through-holes 25 may be formed so as to penetrate straight through the base board 2 along the thickness direction thereof. In any case, the through-holes 25 only need to penetrate through the base board 2.

The pair of through-holes 25 are formed with a pair of penetration electrodes 26 which are formed so as to bury the through-holes 25. The penetration electrodes 26 are formed by a cylindrical member 23 and a core portion 24 which are integrally fixed to the through-holes 25 by baking. The penetration electrodes 26 serve to maintain air-tightness of the inside of the cavity C by completely closing the through-holes 25 and achieve electrical connection between the outer electrodes 29 described later and the lead-out electrodes 28.

The cylindrical member 23 has a truncated conical shape obtained by baking a paste-like glass frit. The core portion 24 is disposed in a penetration hole formed at the center thereof so as to penetrate through the cylindrical member 23.

The core portion 24 is a conductive cylindrical core material made of conductive metallic material, and the electrical connection of the penetration electrodes 26 is secured via the conductive core portion 24.

The upper surface side of the base board 2 (the bonding surface side to be bonded to the lid board 3) is patterned with a bonding film 27 for anodic bonding and the pair of lead-out electrodes 28 by a conductive material (for example, aluminum). Among them, the bonding film 27 is formed along the peripheral edge of the base board 2 so as to surround the periphery of the recess portion 3a formed on the lid board 3.

Moreover, the pair of lead-out electrodes 28 are patterned so that one of the pair of penetration electrodes 26 is electrically connected to one mount electrode 14 of the piezoelectric vibrating reed 4, and the other penetration electrode 26 is electrically connected to the other mount electrode 14 of the piezoelectric vibrating reed 4. More specifically, as shown in FIGS. 2 and 4, the one lead-out electrode 28 is formed right above the one penetration electrode 26 to be disposed right below the base portion 12 of the piezoelectric vibrating reed 4. Moreover, the other lead-out electrode 28 is formed to be disposed right above the other penetration electrode 26 after being led out from a position near one lead-out electrode 28 towards the tip end of the vibrating arm 11 along the vibrating arm 11.

The bumps B are formed on the pair of lead-out electrodes 28, and the piezoelectric vibrating reed 4 is mounted via the bumps B. In this way, one mount electrode 14 of the piezoelectric vibrating reed 4 is electrically connected to one penetration electrode 26 via one lead-out electrode 28, and the other mount electrode 14 is electrically connected to the other penetration electrode 26 via the other lead-out electrode 28.

Moreover, the lower surface of the base board 2 is formed with the outer electrodes 29 which are electrically connected to the pair of penetration electrodes 26, respectively, as shown in FIGS. 1, 3, and 4. That is, one outer electrode 29 is electrically connected to one excitation electrode 13 of the piezoelectric vibrating reed 4 via the one penetration electrode 26 and the one lead-out electrode 28. In addition, the other outer electrode 29 is electrically connected to the other excitation electrode 13 of the piezoelectric vibrating reed 4 via the other penetration electrode 26 and the other lead-out electrode 28.

As shown in FIGS. 2 to 4, on the inner surfaces of the recess portion 3a facing the base board 2, a plurality of kinds (for example, two kinds) of gettering materials (first and second gettering materials 20 and 21) is formed so as to be accommodated in the cavity C.

The first gettering material 20 is disposed at an end in the longitudinal direction of the recess portion 3a (at a side further out than the tip end in the longitudinal direction of the piezoelectric vibrating reed 4). Specifically, the first gettering material 21 is disposed over the entire region extending in the lateral direction of the recess portion 3a in the top view of the piezoelectric vibrator 1 and extends from the end in the longitudinal direction of the recess portion 3a towards the piezoelectric vibrating reed 4 up to a position where it does not overlap with the vibrating arms 10 and 11.

On the other hand, the second gettering material 21 is disposed at a position where laser irradiation can be performed from the outside of the piezoelectric vibrator 1. Since the bottom surface of the recess portion 3a of the lid board 3 is a non-polished surface (having a ground glass form), it is difficult to perform laser irradiation from the outside (the upper surface side of the piezoelectric vibrator 1) of the lid board 3. For this reason, laser irradiation is performed from the outside (the lower surface side of the piezoelectric vibrator 1) of the base board 2. Therefore, the second gettering material 21 is disposed at a position where it does not overlap with the outer electrodes 29 in the top view of the piezoelectric vibrator 1. In addition, the second gettering material 21 is disposed at a position where it does not overlap with the weight metal film 17 in the top view of the piezoelectric vibrator 1 so that the second gettering material 21 does not interrupt the laser irradiation to the weight metal film 17. For this reason, in the present embodiment, a pair of second gettering materials 21 is disposed at both outer sides of the pair of vibrating arms 10 and 11 in the width direction of the piezoelectric vibrating reed 4 so as to extend in the longitudinal direction of the vibrating arms 10 and 11.

The respective gettering materials 20 and 21 are materials which are activated by heating to absorb outgas present in the cavity C, and in the present embodiment, two kinds of gettering materials 20 and 21 having different activation temperatures are used. Specifically, the activation temperature (second activation temperature) of the second gettering material 21 is higher than the activation temperature (first activation temperature) of the first gettering material 20, and thus, the second gettering material 21 is not activated when the first gettering material 20 is activated. In addition, the first gettering material 20 is made of a material having the activation temperature higher than a bonding temperature (for example, about 200 to 300° C.) during anodic bonding of the bonding film 27 which will be described later.

As the materials of the gettering materials 20 and 21, it is preferable to use a non-evaporating gettering material which is activated by heating to exhibit gas absorbing performance on its surface. As the non-evaporating gettering material, transition metals such as zirconium (Zr), titanium (Ti), niobium (Nb), tantalum (Ta), or vanadium (V), and alloys and compounds thereof such as Zr—V—Fe, Zr—V, or Zr—Al can be used. Among the non-evaporating gettering materials mentioned above, a combination such that the second activation temperature of the second gettering material 21 is higher than the first activation temperature of the first gettering material 20 can be appropriately selected. As such a combination, for example, Zr—V—Fe (whose activation temperature is near 400° C.) is preferably used for the first gettering material 20, and Zr—Al (whose activation temperature is near 700° C.) is preferably used for the second gettering material 21. No matter which of the non-evaporating gettering materials is used as the second gettering material 21, the non-evaporating gettering material can be activated by locally heating it to a very high temperature with irradiation of a laser beam.

When the piezoelectric vibrator 1 configured in this manner is operated, a predetermined drive voltage is applied to the outer electrodes 29 formed on the base board 2. In this way, a current can be made to flow to the excitation electrodes 13 of the piezoelectric vibrating reed 4, and the pair of vibrating arms 10 and 11 are allowed to vibrate at a predetermined frequency in a direction to move closer to or away from each other. This vibration of the pair of vibrating arms 10 and 11 can be used as the time source, the timing source of a control signal, the reference signal source, and the like.

Manufacturing Method of Piezoelectric Vibrator

Figure 9:
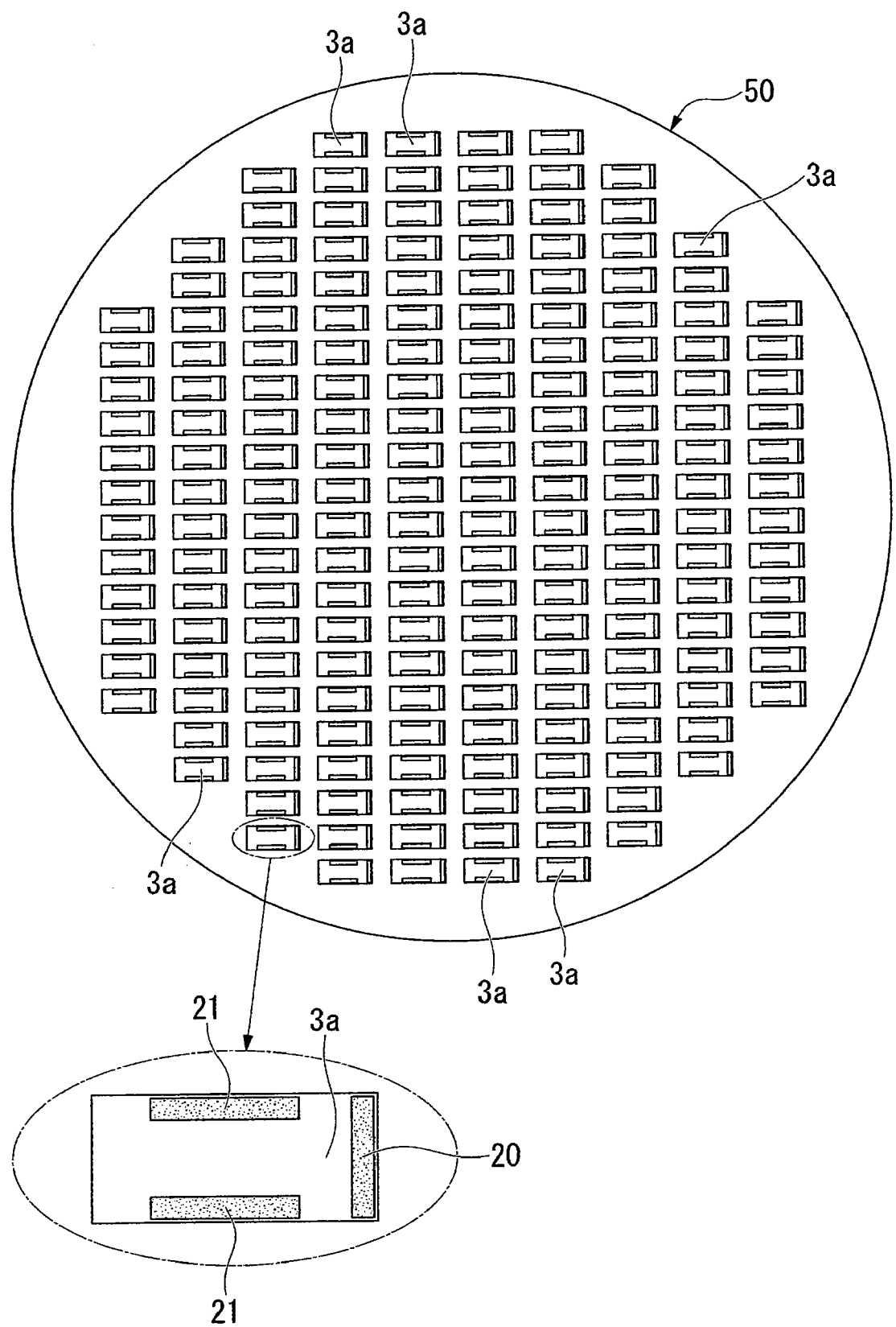
FIG. 9 is a view showing the steps of the manufacturing method of the piezoelectric vibrator, and is an overall view of a lid board wafer serving as a base material of a lid board.
Figure 10:
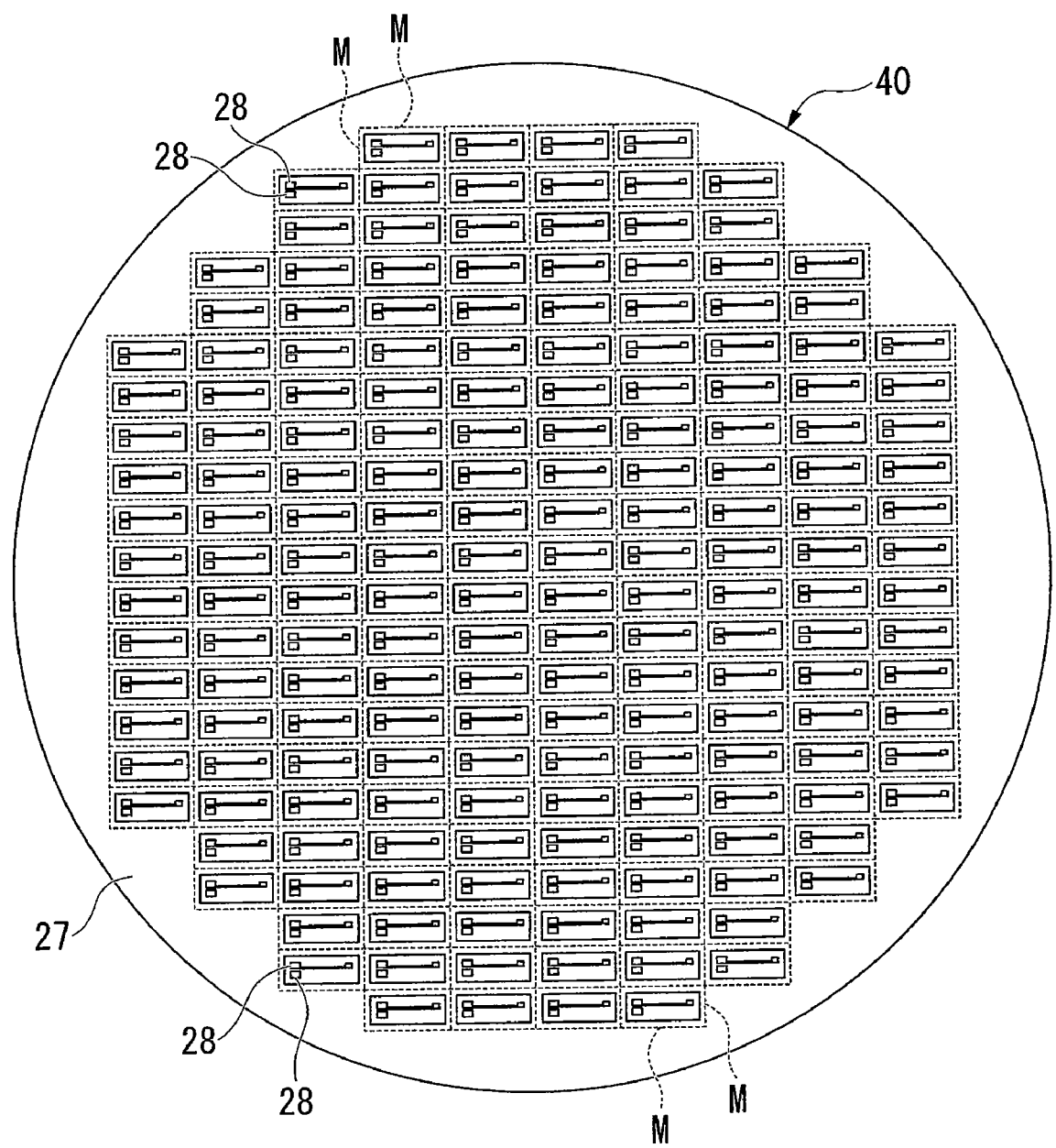
FIG. 10 is a view showing the steps of the manufacturing method of the piezoelectric vibrator, and is an overall view of a base board wafer serving as a base material of a base board.
Figure 11:
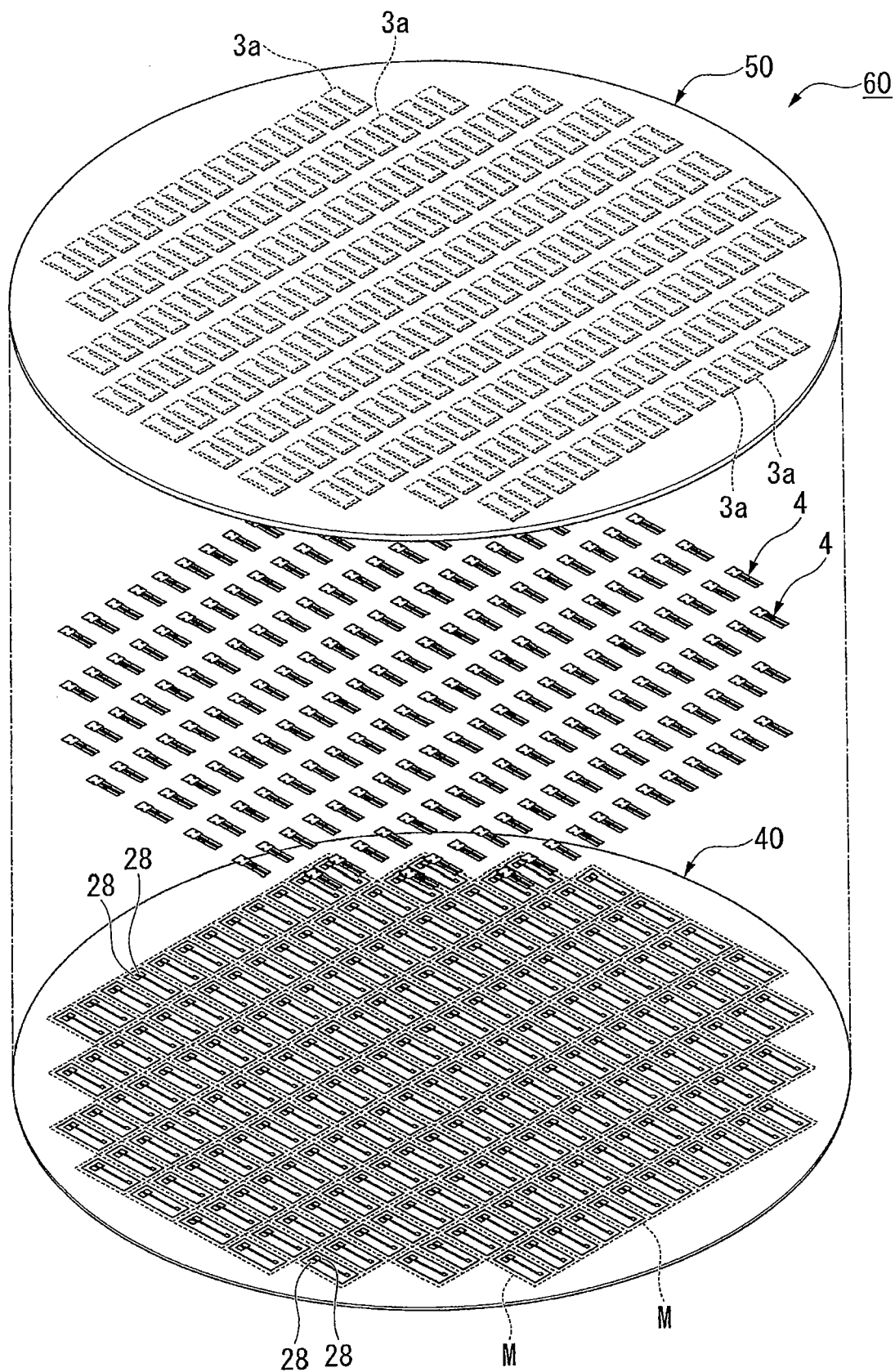
FIG. 11 is a view showing the steps of the manufacturing method of the piezoelectric vibrator, and is an exploded perspective view of a wafer assembly.

Next, a method for manufacturing a plurality of the above-described piezoelectric vibrators 1 at a time using a base board wafer 40 and a lid board wafer 50 will be described with reference to the flowchart shown in FIG. 8. FIGS. 9 to 12 are views showing the steps of the manufacturing method of the piezoelectric vibrator. The dotted line M shown in FIGS. 10 and 11 is a cutting line along which a cutting step performed later is achieved.

First, a piezoelectric vibrating reed manufacturing step is performed to manufacture the piezoelectric vibrating reed 4 shown in FIGS. 5 to 7 (S10). Moreover, after the piezoelectric vibrating reed 4 is manufactured, rough tuning of a resonance frequency is performed. This rough tuning is achieved by irradiating the rough tuning film 17a of the weight metal film 17 with a laser beam to evaporate in part the rough tuning film 17a, thus changing a weight thereof. Fine tuning of adjusting the resonance frequency more accurately is performed after a mounting step is performed. This fine tuning will be described later.

Subsequently, a first wafer manufacturing step is performed where the lid board wafer 50 later serving as the lid board 3 is manufactured up to a stage immediately before anodic bonding is achieved (S20). In this step, first, a disk-shaped lid board wafer 50 is formed as shown in FIG. 9 by polishing a soda-lime glass to a predetermined thickness, cleaning the polished glass, and removing an affected uppermost layer by etching or the like (S21). After that, a recess forming step is performed where a plurality of recess portions 3a to be used as a cavity C is formed in a matrix form on a bonding surface of the lid board wafer 50 (S22).

Subsequently, a gettering material forming step (gettering material disposing step) is performed where gettering materials 20 and 21 are formed in the plurality of recess portions 3a formed on the bonding surface of the lid board wafer 50 by a deposition method or the like (S23).

The first wafer manufacturing step (S20) ends at this point in time.

Subsequently, as shown in FIG. 10, at the same or a different time as the first wafer manufacturing step (S20), a second wafer manufacturing step is performed where a base board wafer 40 later serving as the base board 2 is manufactured up to a stage immediately before anodic bonding is achieved (S30). In this step, first, a disk-shaped base board wafer 40 is formed by polishing a soda-lime glass to a predetermined thickness, cleaning the polished glass, and removing an affected uppermost layer by etching or the like (S31).

Subsequently, a penetration hole forming step is performed where a plurality of pairs of through-holes 25 is formed so as to penetrate through the base board wafer 40 (S32). Specifically, a plurality of pairs of through-holes 25 is formed so as to be received in the recess portions 3a formed on the lid board wafer 50 when the two wafers 40 and 50 are superimposed onto each other later. In addition, the through-holes are formed so that one through-hole 25 is positioned close to the base portion 12 of the piezoelectric vibrating reed 4 mounted later, and the other through-hole 25 is positioned close to the tip end side of the vibrating arm 11. When forming the through-holes 25, it may be helpful to use a sand blast method, press working using a jig, and the like.

Figure 8:
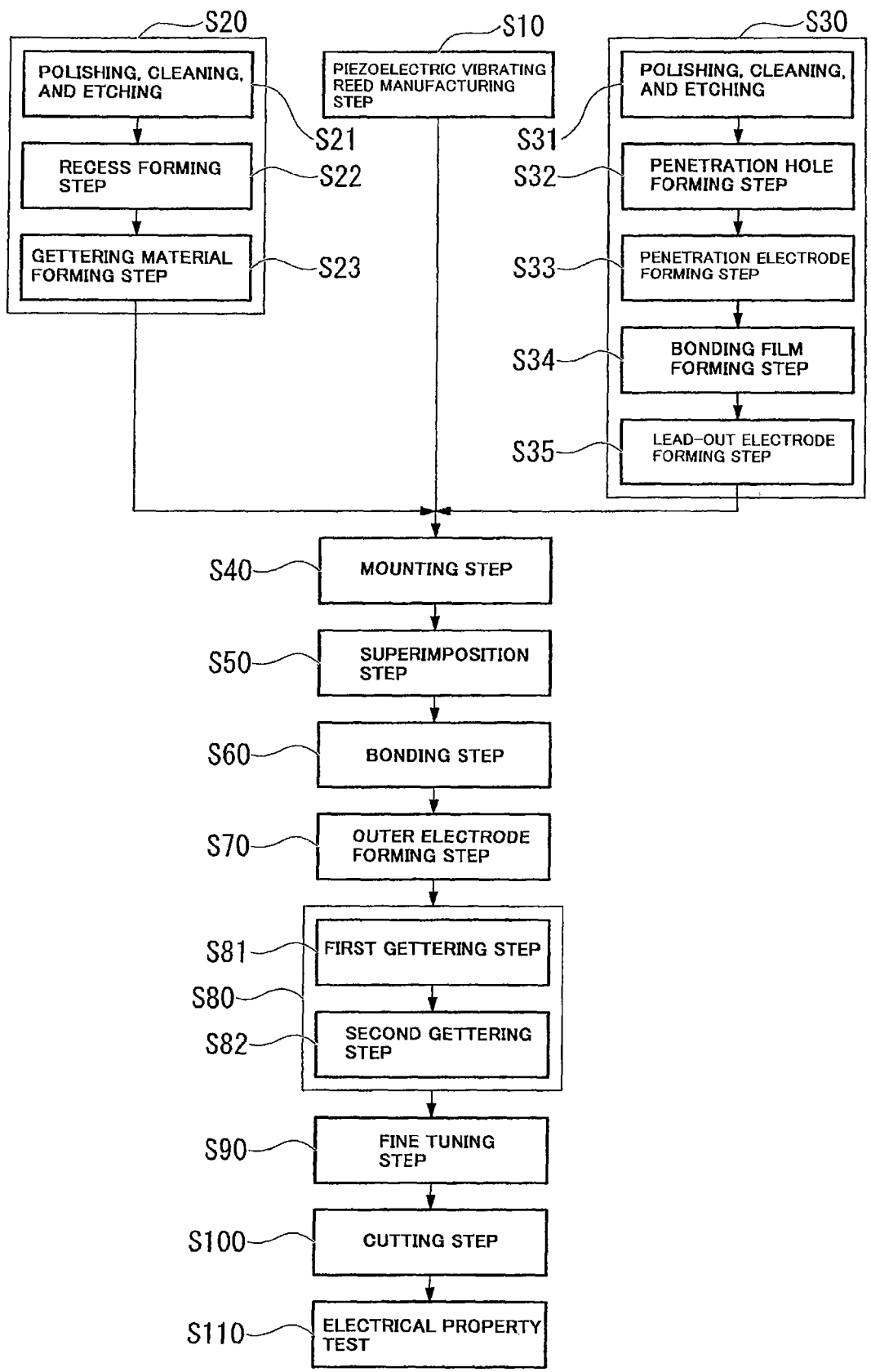
FIG. 8 is a flowchart showing the manufacturing method of the piezoelectric vibrator.

Subsequently, as shown in FIG. 8, a penetration electrode forming step (S33) is performed where penetration electrodes 26 are formed in the through-holes 25 formed during the penetration hole forming step (S32). By doing so, in the through-holes 25, the core portions 24 are maintained to be even with both surfaces (the upper and lower surfaces in FIG. 3) of the base board wafer 40. In this way, the penetration electrodes 26 can be formed.

Subsequently, a bonding film forming step (S34) is performed where a conductive material is patterned on the upper surface of the base board wafer 40 to form a bonding film 27 (see FIG. 10). Moreover, a lead-out electrode forming step is performed where a plurality of lead-out electrodes 28 is formed so as to be electrically connected to each pair of the penetration electrodes 26 (S35).

By this step, one penetration electrode 26 is electrically connected to one lead-out electrode 28, and the other penetration electrode 26 is electrically connected to the other lead-out electrode 28. The second wafer manufacturing step (S30) ends at this point in time.

In FIG. 8, although the lead-out electrode forming step (S35) is performed after the bonding film forming step (S34), conversely, the bonding film forming step (S34) may be performed after the lead-out electrode forming step (S35), and the two steps may be performed at the same time. The same operational effect can be obtained with any order of the steps.

Therefore, the order of the steps may be appropriately changed according to the needs.

Subsequently, a mounting step is performed where a plurality of manufactured piezoelectric vibrating reeds 4 is bump-bonded to the upper surface of the base board wafer 40 via the lead-out electrodes 28 (S40). First, bumps B made of gold or the like are formed on the pair of lead-out electrodes 28. The base portion 12 of the piezoelectric vibrating reed 4 is placed on the bumps B, and thereafter the piezoelectric vibrating reed 4 is pressed against the bumps B while heating the bumps B to a predetermined temperature. In this way, the piezoelectric vibrating reed 4 is mechanically supported by the bumps B, and the mount electrodes 14 are electrically connected to the lead-out electrodes 28. Therefore, at this point in time, the pair of excitation electrodes 13 of the piezoelectric vibrating reed 4 are electrically connected to the pair of penetration electrodes 26, respectively. Particularly, since the piezoelectric vibrating reed 4 is bump-bonded, the piezoelectric vibrating reed 4 is supported in a state of being floated from the upper surface of the base board wafer 40.

After the piezoelectric vibrating reed 4 is mounted, a superimposition step is performed where the lid board wafer 50 is superimposed onto the base board wafer 40 (S50). Specifically, both wafers 40 and 50 are aligned at a correct position using reference marks or the like not shown in the figure as indices. In this way, the mounted piezoelectric vibrating reed 4 and the gettering materials 20 and 21 are accommodated in the recess portion 3a formed on the base board wafer 40 and the cavity C which is surrounded by both wafers 40 and 50.

After the superimposition step (S50) is performed, a bonding step is performed where the two superimposed wafers 40 and 50 are inserted into an anodic bonding machine not shown and heated to a predetermined temperature (bonding temperature) to achieve anodic bonding with application of a predetermined voltage (S60). Specifically, a predetermined voltage is applied between the bonding film 27 and the lid board wafer 50. Then, an electrochemical reaction occurs at an interface between the bonding film 27 and the lid board wafer 50, whereby they are closely adhered tightly and anodically bonded. In this way, the piezoelectric vibrating reed 4 can be sealed in the cavity C, and a wafer assembly 60 shown in FIG. 11 can be obtained in which the base board wafer 40 and the lid board wafer 50 are bonded to each other. In FIG. 11, for better understanding of the figure, the wafer assembly 60 is illustrated in an exploded state, and illustration of the bonding film 27 is omitted from the base board wafer 40. When the anodic bonding is performed, since the through-holes 25 formed on the base board wafer 40 are completely closed by the penetration electrodes 26, the airtightness in the cavity C will not be impaired by the through-holes 25.

After the above-described anodic bonding is completed, an outer electrode forming step is performed where a conductive material is patterned onto the lower surface of the base board wafer 40 so as to form a plurality of pairs of outer electrodes 29 which is electrically connected to the pair of penetration electrodes 26 (S70). By this step, the piezoelectric vibrating reed 4 which is sealed in the cavity C can be operated using the outer electrodes 29.

Meanwhile, in the bonding step (S60), when the wafer assembly 60 is heated, outgas (for example, oxygen) is discharged into each cavity C. When the outgas is present in the cavity C, the degree of vacuum in the cavity C decreases and the equivalent resistance value (effective resistance value Re) increases. As a result, the drive voltage of the piezoelectric vibrator 1 increases, and thus the energy efficiency decreases.

Therefore, in the present embodiment, in order to improve the degree of vacuum in the cavity C, a gettering step is performed where the gettering materials 20 and 21 accommodated in each cavity C of the wafer assembly 60 are activated so as to adjust the degree of vacuum in the cavity C (S80).

In the gettering step (S80), first, a first gettering step (S81) is performed where the outgas in the cavity C is absorbed by the first gettering material 20. Specifically, the piezoelectric vibrator 1 is heated to the activation temperature of the first gettering material 20 to activate the first gettering material 20. Then, the activated first gettering material 20 absorbs the outgas in the cavity C to form metal oxides. In this way, oxygen in the cavity C is consumed, whereby the degree of vacuum can be improved.

However, there is a concern that the remaining outgas generated during the bonding step (S60) or a small amount of outgas discharged by heating during the first gettering step (S81) may remain in the cavity C of the wafer assembly 60.

Figure 12:
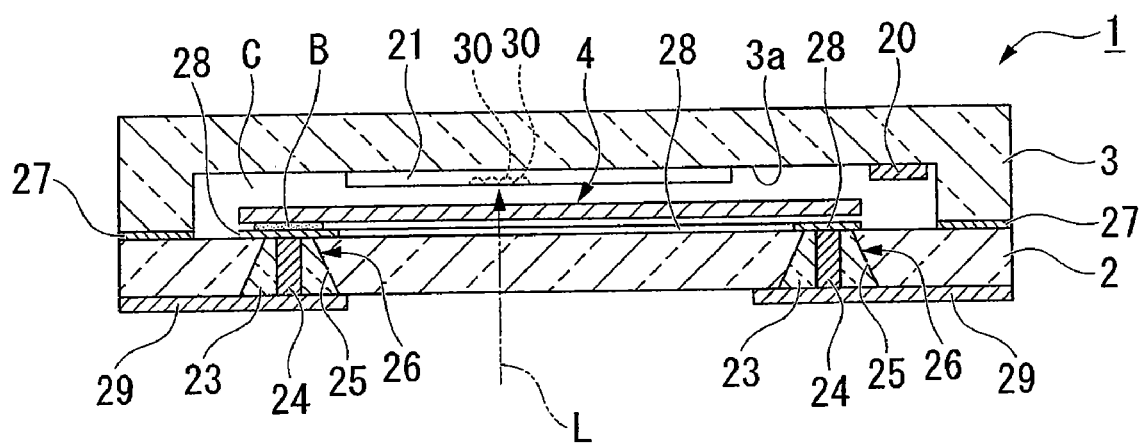
FIG. 12 is a view showing the steps of the manufacturing method of the piezoelectric vibrator, and is a sectional view of the piezoelectric vibrator corresponding to FIG. 3.

Therefore, after the first gettering step (S81) is performed, a second gettering step (S82) is performed where the outgas in the cavity C is absorbed by the second gettering material 21. Specifically, as shown in FIG. 12, a laser beam L is irradiated from the side of the base board wafer 40 to heat the second gettering material 21, whereby the second gettering material 21 is evaporated and activated. As a laser source used at that time, a YAG laser or the like can be used similar to that used in a fine tuning step (S90) described later.

When the laser beam L is irradiated onto the second gettering material 21, the surface of the second gettering material 21 is evaporated, and laser irradiation marks 30 are formed on the evaporated portion. Materials constituting the second gettering material 21 evaporated with the laser irradiation are scattered in the cavity C to absorb oxygen in the cavity C to form metal oxides. In this way, oxygen in the cavity C is consumed, whereby the degree of vacuum can be improved to a certain level or more. Here, a certain level means a state where an effective resistance value does not change greatly even when the degree of vacuum is improved further. In this way, a suitable effective resistance value can be secured.

In addition, when the gettering is performed at the vicinity of the vibrating arms 10 and 11 of the piezoelectric vibrating reed 4, there is a concern that materials generated by the gettering are deposited onto the vibrating arms 10 and 11, thus changing the frequency of the piezoelectric vibrating reed 4. However, even when the frequency of the piezoelectric vibrating reed 4 is changed during the gettering step (S80), the frequency of the piezoelectric vibrator 1 can be finely tuned in a fine tuning step described later.

After the gettering step (S80) is performed, a fine tuning step is performed on the wafer assembly 60 where the frequencies of the individual piezoelectric vibrators 1 sealed in the cavities C are tuned finely to fall within a predetermined range (S90). Specifically, a voltage is applied to the outer electrodes 29, thus allowing the piezoelectric vibrating reeds 4 to vibrate. A laser beam is irradiated onto the base board wafer 40 from the outer side while measuring the vibration frequencies to evaporate the fine tuning film 17b of the weight metal film 17. In this way, since the weight on the tip ends of the pair of vibrating arms 10 and 11 is changed, the frequency of the piezoelectric vibrating reed 4 can be finely tuned so as to fall within the predetermined range of the nominal frequency. In addition, by irradiating the laser beam in the same directions during the second gettering step (S80) and the fine tuning step (S90), it is not necessary to change the orientation of the wafer assembly 60, and accordingly, the manufacturing efficiency can be improved.

After the fine tuning of the frequency is completed, a cutting step is performed where the bonded wafer assembly 60 is cut along the cutting line M shown in FIG. 11 to obtain small fragments (S100). As a result, a plurality of SMD-type piezoelectric vibrators 1 shown in FIG. 1, in which the piezoelectric vibrating reed 4 is sealed in the cavity C that is formed between the base board 2 and the lid board 3 being anodically bonded together, can be manufactured at a time.

The fine tuning step (S90) may be performed after performing the cutting step (S100) to obtain the individual fragments of the piezoelectric vibrators 1. However, as described above, by performing the fine tuning step (S90) earlier, since the fine tuning step can be performed on the wafer assembly 60, it is possible to perform the fine tuning on the plurality of piezoelectric vibrators 1 more efficiently. Therefore, it is desirable because throughput can be improved.

Subsequently, an inner electrical property test is conducted (S110). That is, the resonance frequency, resonance resistance value, drive level properties (the excitation power dependence of the resonance frequency and the resonance resistance value), and the like of the piezoelectric vibrating reed 4 are measured and checked. Moreover, the insulation resistance properties and the like are checked as well. Finally, an external appearance test of the piezoelectric vibrator 1 is conducted to check the dimensions, the quality, and the like. In this way, the manufacturing of the piezoelectric vibrator 1 ends.

As described above, in the present embodiment, two kinds of gettering materials 20 and 21 having different activation temperatures are disposed on the inner surface of the cavity C.

According to this configuration, by disposing a plurality of kinds of gettering materials 20 and 21 having different activation temperatures in the cavity C, it is possible to activate the gettering materials 20 and 21 at plural temperature ranges and absorb outgas present in the cavity C. Specifically, by performing the first gettering step (S81) after completion of the bonding step (S60), it is possible to absorb the outgas discharged into the cavity C during the bonding step (S60) with the first gettering material 20.

In addition, by performing the second gettering step (S82) after completion of the first gettering step (S81), it is possible to absorb the outgas remaining in the cavity C after completion of the first gettering step (S81). In this way, it is possible to improve the degree of vacuum in the cavity C and decrease the equivalent resistance value of the piezoelectric vibrator 1. As a result, it is possible to provide the piezoelectric vibrator 1 having a low drive voltage and high energy efficiency. In addition, it is possible to obtain stable vibration characteristics and achieve improvement in the quality of the piezoelectric vibrator 1.

In addition, by using a non-evaporating gettering material as the first gettering material 20, it is possible to prevent the first gettering material 20 from being scattered in the cavity C during the first gettering step (S81). Since the non-evaporating gettering material can be activated at a relatively low temperature compared to an evaporating gettering material, it is possible to suppress the outgas from being discharged into the cavity C again.

Furthermore, since the first gettering material 20 is made of a material whose activation temperature is higher than the bonding temperature during the bonding step (S60), it is possible to prevent the first gettering material 20 from being degraded before bonding the two board wafer 40 and 50. In this way, the first gettering material 20 can exhibit a desired absorbing performance during the subsequent first gettering step (S81), and the outgas present in the cavity C can be effectively absorbed.

Furthermore, in the second gettering step (S82), the second gettering material 21 is activated by laser irradiation.

According to this configuration, by locally heating only the second gettering material 21 with a laser beam L, it is possible to suppress a temperature rise of the entire piezoelectric vibrator 1. In this way, it is possible to prevent generation of outgas resulting from the temperature rise of the piezoelectric vibrator 1 and effectively absorb the outgas remaining in the cavity C.

In addition, since the weight metal film 17, the outer electrodes 29, and the second gettering material 21 are disposed so that they do not overlap with each other in top view, the laser beam L can be effectively irradiated onto the second gettering material 21 during the second gettering step (S82) without being blocked by the weight metal film 17 and the outer electrodes 29. In this case, by disposing the second gettering material 21 on the inner surface of the recess portion 3a of the lid board 3, the laser beam L is irradiated onto the surface of the second gettering material 21 from the side of the base board wafer 40. Therefore, by activating the second gettering material 21 quickly, it is possible to improve the manufacturing efficiency.

In addition, since the laser beam is not blocked by the gettering materials 20 and 21 during the fine tuning step (S90), it is possible to effectively irradiate the laser beam onto the weight metal film 17 and achieve improvement in the manufacturing efficiency.

Oscillator

Next, an oscillator according to an embodiment of the present invention will be described with reference FIG. 13.

Figure 13:
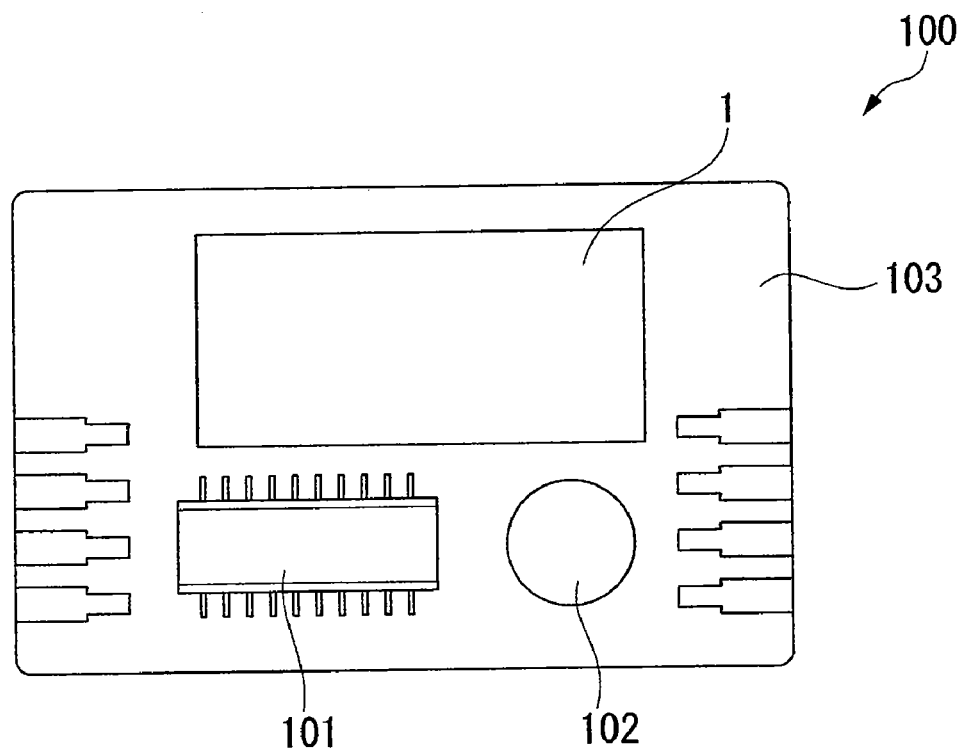
FIG. 13 is a view showing the configuration of an oscillator according to an embodiment of the present invention.

As shown in FIG. 13, an oscillator 100 of the present embodiment is one in which the piezoelectric vibrator 1 is configured as an oscillating piece that is electrically connected to an integrated circuit 101. The oscillator 100 includes a board 103 on which an electronic component 102 such as a capacitor is mounted. The integrated circuit 101 for the oscillator is mounted on the board 103, and the piezoelectric vibrating reed 4 of the piezoelectric vibrator 1 is mounted in the vicinity of the integrated circuit 101. The electronic component 102, the integrated circuit 101, and the piezoelectric vibrator 1 are electrically connected by a wiring pattern which is not shown. It should be noted that these components are molded by resin which is not shown.

In the oscillator 100 configured in this manner, the piezoelectric vibrating reed 4 in the piezoelectric vibrator 1 vibrates when a voltage is applied to the piezoelectric vibrator 1. This vibration is converted to an electrical signal by the piezoelectric properties of the piezoelectric vibrating reed 4 and is then input to the integrated circuit 101 as the electrical signal. The input electrical signal is subjected to various kinds of processing by the integrated circuit 101 and is then output as a frequency signal. In this way, the piezoelectric vibrator 1 functions as an oscillating piece.

By selectively setting the configuration of the integrated circuit 101, for example, an RTC (Real Time Timepiece) module, according to the demands, it is possible to add a function of controlling the date or time for operating the device or an external device or providing the time or calendar other than a single-function oscillator for a timepiece.

According to the oscillator 100 of the present embodiment, since the oscillator includes the piezoelectric vibrator 1 having improved quality, it is possible to achieve improvement in the quality of the oscillator 100 itself. In addition to this, it is possible to obtain a highly accurate frequency signal which is stable over a long period of time.

Electronic Device

Figure 14:
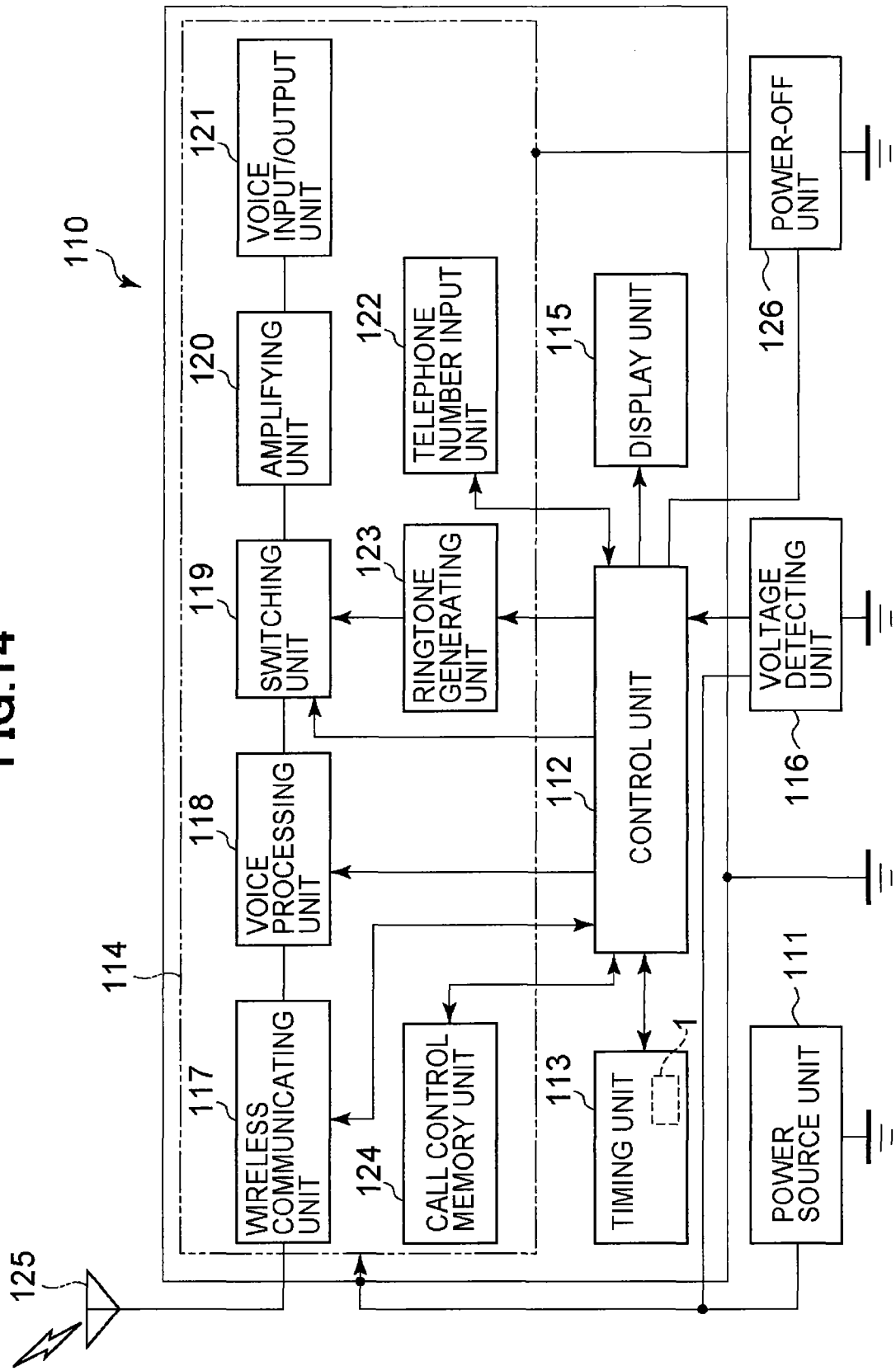
FIG. 14 is a view showing the configuration of an electronic device according to an embodiment of the present invention.

Next, an electronic device according to an embodiment of the present invention will be described with reference to FIG. 14. The present embodiment will be described by way of an example of a portable information device 110 having the piezoelectric vibrator 1 as an example of the electronic device. First, the portable information device 110 of the present embodiment is represented, for example, by a cellular phone and is one that develops and improves a wristwatch of the related art. The portable information device 110 looks like a wristwatch in external appearance and is provided with a liquid crystal display at a portion corresponding to the dial pad and is capable of displaying the current time or the like on the screen. When the portable information device 110 is used as a communication tool, the user removes it from the wrist and performs communication as with a cellular phone of the related art using the internal speaker and microphone on the inner side of its strap. However, the portable information device 110 is remarkably small and light compared with the cellular phone of the related art. Portable Information Device Next, the configuration of the portable information device 110 of the present embodiment will be described. As shown in FIG. 14, the portable information device 110 includes the piezoelectric vibrator 1 and a power supply portion 111 for supplying power. The power supply portion 111 is formed, for example, of a lithium secondary battery. The power supply portion 111 is connected in parallel to a control portion 112 that performs various kinds of control, a timer portion 113 that counts the time or the like, a communication portion 114 that performs communication with the outside, a display portion 115 that displays various kinds of information, and a voltage detection portion 116 that detects voltages at the respective function portions. The power supply portion 111 supplies power to the respective functional portions.

The control portion 112 controls the respective function portions so as to control operations of the overall system, such as operations to transmit and receive sound data and operations to count and display the current time. The control portion 112 includes a ROM in which a program is written in advance, a CPU that reads out and runs the program written to the ROM, a RAM used as a work area of the CPU, and the like.

The timer portion 113 includes an integrated circuit enclosing an oscillation circuit, a register circuit, a counter circuit, and an interface circuit, and the like as well as the piezoelectric vibrator 1. When a voltage is applied to the piezoelectric vibrator 1, the piezoelectric vibrating reed 4 vibrates, and this vibration is converted to an electrical signal by the piezoelectric characteristics of the quartz and is input to the oscillation circuit as the electrical signal. The output of the oscillation circuit is converted to a digital form and counted by the register circuit and the counter circuit. Signals are transmitted and received to and from the control portion 112 via the interface circuit, and the current time and the current date or the calendar information or the like are displayed on the display portion 115.

The communication portion 114 is provided with the same functions as those of the cellular phone of the related art, and includes a wireless portion 117, a sound processing portion 118, a switching portion 119, an amplifier portion 120, a sound input/output portion 121, a telephone number input portion 122, a ring tone generation portion 123, and a call control memory portion 124.

The wireless portion 117 carries out transmission and reception of various kinds of data, such as sound data, with the base station via an antenna 125. The sound processing portion 118 encodes and decodes a sound signal input therein from the wireless portion 117 or the amplifier portion 120. The amplifier portion 120 amplifies a signal input therein from the sound processing portion 118 or the sound input/output portion 121 to a predetermined level. The sound input/output portion 121 is formed of a speaker and a microphone, and makes a ring tone and an incoming sound louder, as well as collecting sounds.

The ring tone generation portion 123 generates a ring tone in response to a call from the base station. The switching portion 119 switches the amplifier portion 120 normally connected to the sound processing portion 118 to the ring tone generation portion 123 only when a call arrives, so that the ring tone generated in the ring tone generation portion 123 is output to the sound input/output portion 121 via the amplifier portion 120.

The call control memory portion 124 stores a program relating to incoming and outgoing call control for communications. The telephone number input portion 122 includes, for example, numeric keys from 0 to 9 and other keys and the user inputs the telephone number of the communication party by depressing these numeric keys.

The voltage detection portion 116 detects a voltage drop when a voltage being applied to each function portion, such as the control portion 112, by the power supply portion 111 drops below the predetermined value, and notifies the control portion 112 of the detection. The predetermined voltage value referred to herein is a value pre-set as the lowest voltage necessary to operate the communication portion 114 in a stable manner, and for example, is about 3 V. Upon receipt of a notification of a voltage drop from the voltage detection portion 116, the control portion 112 disables the operation of the wireless portion 117, the sound processing portion 118, the switching portion 119, and the ring tone generation portion 123. In particular, it is essential to stop the operation of the wireless portion 117 that consumes a large amount of power. Furthermore, a message informing that the communication portion 114 is unavailable due to insufficient battery power is displayed on the display portion 115.

More specifically, it is possible to disable the operation of the communication portion 114 and display the notification message on the display portion 115 by the voltage detection portion 116 and the control portion 112. This message may be displayed as a character message, or as a more intuitive indication, which may be displayed by putting a cross mark on the telephone icon displayed at the top of the display screen of the display portion 115.

By providing a power shutdown portion 126 capable of selectively shutting down the power supply to portions involved with the function of the communication portion 114, it is possible to stop the function of the communication portion 114 in a more reliable manner.

According to the portable information device 110 of the present embodiment, since the portable information device includes the piezoelectric vibrator 1 having improved quality, it is possible to achieve improvement in the quality of the portable information device itself. In addition to this, it is possible to display highly accurate timepiece information which is stable over a long period of time.

Radio-Controlled Timepiece

Next, a radio-controlled timepiece according to an embodiment of the present invention will be described with reference to FIG. 15.

Figure 15:
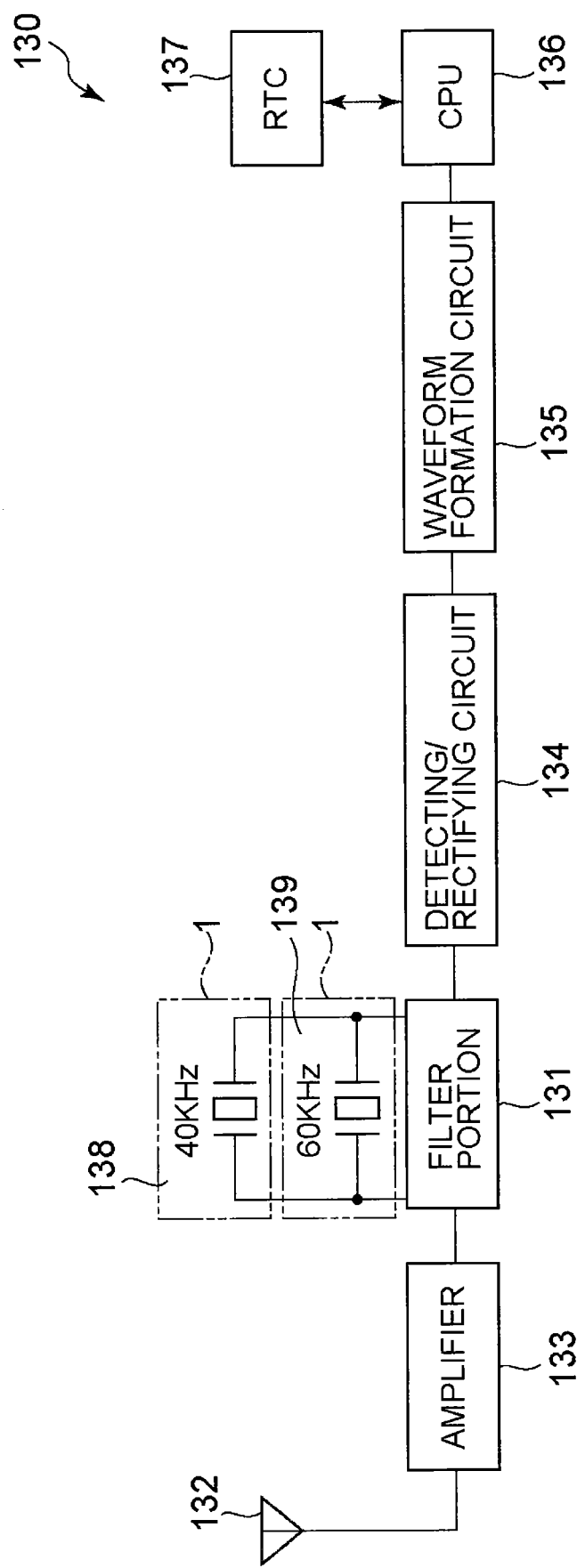
FIG. 15 is a view showing the configuration of a radio-controlled timepiece according to an embodiment of the present invention.

As shown in FIG. 15, a radio-controlled timepiece 130 of the present embodiment includes the piezoelectric vibrators 1 electrically connected to a filter portion 131. The radio-controlled timepiece 130 is a timepiece provided with the function of displaying the correct time by automatically correcting the time upon receipt of a standard radio wave including the timepiece information.

In Japan, there are transmission centers (transmission stations) that transmit a standard radio wave in Fukushima Prefecture (40 kHz) and Saga Prefecture (60 kHz), and each center transmits the standard radio wave. A wave as long as 40 kHz or 60 kHz has a nature to propagate along the land surface and a nature to propagate while reflecting between the ionospheric layer and the land surface, and therefore has a propagation range wide enough to cover all Japan by the two transmission centers.

Hereinafter, the functional configuration of the radio-controlled timepiece 130 will be described in detail.

An antenna 132 receives the long standard radio wave at 40 kHz or 60 kHz. The long standard radio wave is made up of time information called a time code which is modulated by the AM modulation scheme and carried on a carrier wave of 40 kHz or 60 kHz. The received long standard wave is amplified by an amplifier 133 and filtered and synchronized by the filter portion 131 having a plurality of piezoelectric vibrators 1.

In the present embodiment, the piezoelectric vibrators 1 include quartz vibrator portions 138 and 139 having resonance frequencies at 40 kHz and 60 kHz which are the same as the carrier frequency.

Furthermore, the filtered signal at the predetermined frequency is detected and demodulated by a detection and rectification circuit 134. Subsequently, the time code is extracted by a waveform shaping circuit 135 and counted by the CPU 136. The CPU 136 reads out information about the current year, the total number of days, a day of the week, and the time. The read information is reflected on the RTC 137 and the precise time information is displayed.

Because the carrier wave is 40 kHz or 60 kHz, a vibrator having the tuning-fork structure described above is suitable for the quartz vibrator portions 138 and 139.

Although the above description has been given to the example in Japan, the frequency of the long standard wave is different overseas. For example, a standard wave of 77.5 kHz is used in Germany. When the radio-controlled timepiece 130 which is also operable overseas is incorporated into a portable device, the piezoelectric vibrator 1 set at the frequency different from the frequencies used in Japan is required.

According to the radio-controlled timepiece 130 of the present embodiment, since the radio-controlled timepiece includes the piezoelectric vibrator 1 having improved quality, it is possible to achieve improvement in the quality of the radio-controlled timepiece itself. In addition to this, it is possible to count the time highly accurately and stably over a long period of time.

Although the embodiments of the present invention have been described in detail with reference to the drawings, the detailed configuration is not limited to the embodiments, and various changes can be made in design without departing from the spirit of the present invention.

Figure 16:
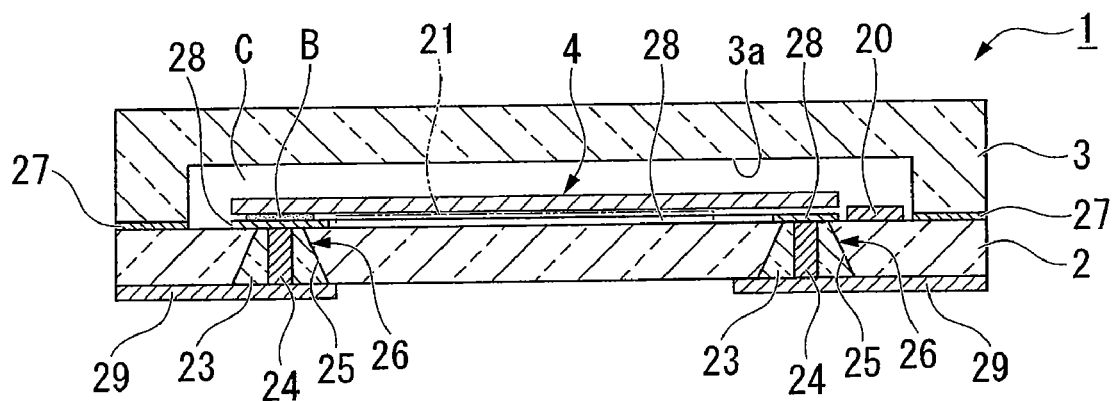
FIG. 16 is a sectional view of a piezoelectric vibrator according to another embodiment of the present invention.
Figure 17:
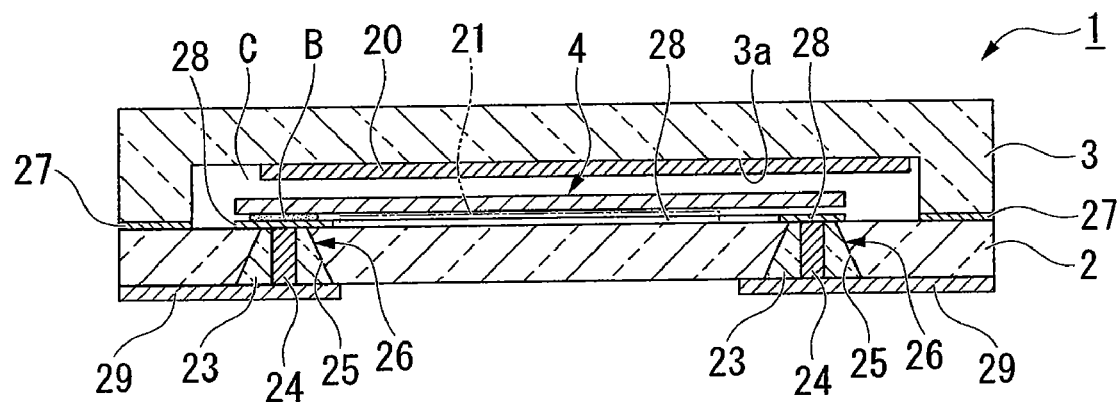
FIG. 17 is a sectional view of a piezoelectric vibrator according to another embodiment of the present invention.

The disposed positions of the gettering materials 20 and 21 can be appropriately changed. For example, although in the above-described embodiment, both gettering materials 20 and 21 are formed on the lid board 3, they may be formed on the base board 2. Specifically, as shown in FIG. 16, the first gettering material 20 may be disposed on the upper surface of the base board 2 at the outer side in the longitudinal direction of the piezoelectric vibrating reed 4, and the second gettering material 21 may be disposed on both outer sides in the width direction of the piezoelectric vibrating reed 4. In addition, as shown in FIG. 17, the first gettering material 20 may be disposed on the entire inner surface of the cavity C facing the base board 2.

However, the same operational effect can be obtained in such cases.

The present invention is not limited to the glass-packaged piezoelectric vibrator 1, but the present invention can be applied to a ceramic-packaged piezoelectric vibrator. In addition, the electronic components sealed in the cavity C are not limited to the piezoelectric vibrating reed 4.

In the embodiment, although the first and second gettering materials 20 and 21 are made of the non-evaporating gettering material, the present invention is not limited to this, and the second gettering material 21 may be made of an evaporating gettering material. The evaporating gettering material is a material that exhibits gas absorbing performance by being evaporated and activated with laser irradiation, and examples thereof include aluminum (Al), chrome (Cr), nickel (Ni), samarium (Sm), Ba—Al—Ni alloys, and the like.

For example, although the above-described embodiments have been described by way of an example of the grooved piezoelectric vibrating reed 4 in which the groove portions 15 are formed on both surfaces of the vibrating arms 10 and 11 as an example of the piezoelectric vibrating reed 4, the piezoelectric vibrating reed 4 may be a type of piezoelectric vibrating reed without the groove portions 15. However, since the field efficiency between the pair of the excitation electrodes 13 when a predetermined voltage is applied to the pair of excitation electrodes 13 can be increased by forming the groove portions 15, it is possible to suppress the vibration loss further and to improve the vibration properties much more. That is to say, it is possible to decrease the CI value (crystal impedance) further and to improve the performance of the piezoelectric vibrating reed 4 further. In this respect, it is preferable to form the groove portions 15.

Moreover, although in the above-described embodiments, the base board 2 and the lid board 3 are anodically bonded by the bonding film 27, the bonding method is not limited to the anodic bonding. However, anodic bonding is preferable because the anodic bonding can tightly bond both boards 2 and 3.

Furthermore, although in the above-described embodiments, the piezoelectric vibrating reed 4 is bonded by bumps, the bonding method is not limited to bump bonding. For example, the piezoelectric vibrating reed 4 may be bonded by a conductive adhesive agent. However, since the bump bonding allows the piezoelectric vibrating reed 4 to be floated from the upper surface of the base board 2, it is naturally possible to secure the minimum vibration gap necessary for vibration of the piezoelectric vibrating reed 4. Therefore, bump bonding is preferable.

The invention claimed is:

1. A piezoelectric vibrator comprising:
a hermetically closed casing comprising first and second substrates with a cavity formed therebetween;
a piezoelectric vibrating strip secured in the cavity; and
first and second getter materials having different activation temperatures placed in the cavity.

2. The piezoelectric vibrator according to claim 1, wherein the first and second substrates bonded anodically at a boding temperature via a bonding film placed between the first and second substrates, and the activation temperatures of the first and second getter materials are higher than the bonding temperature.

3. The piezoelectric vibrator according to claim 1, wherein the first and second getter materials are positioned in the cavity to avoid overlapping with the piezoelectric vibrating strip in a plane view.

4. The piezoelectric vibrator according to claim 1, wherein the first and second getter materials are made of non-evaporating getter material.

5. The piezoelectric vibrator according to claim 1, wherein the first and second getter materials are made of transition metals.

6. The piezoelectric vibrator according to claim 5, wherein the transition metals are selected from the group consisting of zirconium (Zr), titanium (Ti), niobium (Nb), tantalum (Ta), vanadium (V), and alloys and compounds thereof.

7. The piezoelectric vibrator according to claim 6, wherein the first getter material is made of Zr—V—Fe, Zr—V, and the second getter material is made of Zr—Al.

8. An oscillator comprising the piezoelectric vibrator defined in claim 1.

9. An electronic device comprising the piezoelectric vibrator defined in claim 1.

10. The electronic device according to claim 9, wherein the electronic device is an atomic clock.

11. A method for producing piezoelectric vibrators, comprising:
(a) defining a plurality of first substrates on a first wafer and a plurality of second substrates on a second wafer;
(b) forming first and second getter materials having different activation temperatures on respective at least some of at least one of the first and second substrates;
(b) layering the first and second wafers such that at least some of the first substrates substantially coincide respectively with at least some of the corresponding second substrates, wherein between respective pairs of at least some of coinciding first and second substrates, a cavity is formed in which a piezoelectric vibrating strip and the first and second getter materials are placed;
(c) hermetically bonding the first and second substrates of at least some of the respective pairs;
(d) heating at least some of the respective pairs to a temperature higher than the activation temperature of the first getter material but lower than the activation temperature of the second getter material to only activate the first getter material; and
(e) regionally heating the second getter material in respective at least some of the pairs heated in step (d) to a temperature higher than the activation temperature thereof to only activate the second getter material.

12. The method according to claim 11, wherein hermetically bonding the first and second substrates comprises anodically bonding the first and second substrates at a boding temperature via a bonding film placed between the first and second substrates.

13. The method according to claim 12, wherein the activation temperatures of the first and second getter materials are higher than the bonding temperature.

14. The method according to claim 13, wherein forming first and second getter materials comprises placing the first and second getter materials in positions to avoid overlapping with the piezoelectric vibrating strip in the cavity in a plane view.

15. The method according to claim 11, wherein the second getter material takes a form of a pair of getter films, and forming the first and second getter materials comprises placing the pair of getter films so as to lie on both sides of the piezoelectric vibrating strip in the cavity.

16. The method according to claim 11, further comprising regionally heating the piezoelectric vibrating strip to remove an adjustable weight from the piezoelectric vibrating strip to thereby adjust the frequency of the piezoelectric vibrating strip.

17. The method according to claim 11, wherein the first and second getter materials are made of non-evaporating getter material.

18. The method according to claim 11, wherein the first and second getter materials are made of transition metals.

19. The method according to claim 18, wherein the transition metals are selected from the group consisting of zirconium (Zr), titanium (Ti), niobium (Nb), tantalum (Ta), vanadium (V), and alloys and compounds thereof.

20. The method according to claim 19, wherein the first getter material is made of Zr—V—Fe, Zr—V, and the second getter material is made of Zr—Al.

* * * * *